(12) United States Patent
Chen et al.

(10) Patent No.: US 12,211,917 B2
(45) Date of Patent: Jan. 28, 2025

(54) SEAL RING FOR SEMICONDUCTOR DEVICE

(71) Applicant: TAIWAN SEMICONDUCTOR MANUFACTURING COMPANY, LTD., Hsinchu (TW)

(72) Inventors: Chun Yu Chen, Hsinchu (TW); Yen Lian Lai, New Taipei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 418 days.

(21) Appl. No.: 17/832,647

(22) Filed: Jun. 5, 2022

(65) Prior Publication Data

US 2023/0395680 A1    Dec. 7, 2023

(51) Int. Cl.
*H01L 29/423*    (2006.01)
*H01L 21/762*    (2006.01)
(Continued)

(52) U.S. Cl.
CPC .. *H01L 29/42392* (2013.01); *H01L 21/76224* (2013.01); *H01L 23/562* (2013.01);
(Continued)

(58) Field of Classification Search
CPC ........ H01L 29/42392; H01L 21/76224; H01L 23/562; H01L 29/0673; H01L 29/66545;
(Continued)

(56) References Cited

U.S. PATENT DOCUMENTS 7,235,864 B2    6/2007 Lee
8,022,550 B2    9/2011 Koubuchi et al.
(Continued)

FOREIGN PATENT DOCUMENTS

TW    201919158 A    5/2019

OTHER PUBLICATIONS

Huang et al., "Dummy Patters in Redundant Region of Double Seal Ring", U.S. Appl. No. 17/336,977, filed Jun. 2, 2021, Assignee: Taiwan Semiconductor Manufacturing Company, Ltd., 24 pages specification, 8 pages drawings.

*Primary Examiner* — J. E. Schoenholtz
(74) *Attorney, Agent, or Firm* — HAYNES AND BOONE, LLP

(57) ABSTRACT

A method includes providing a structure having a substrate and first and second semiconductor layers alternately stacked one over another above the substrate, etching the first and the second semiconductor layers to form a first continuous ring in a seal ring region of the structure, and forming an isolation structure adjacent the first continuous ring in the seal ring region. The method further includes forming a dummy gate structure that is disposed directly above the first continuous ring and completely within a boundary of the first continuous ring from a top view, growing first and second epitaxial features sandwiching the dummy gate structure, removing the dummy gate structure, resulting in a gate trench that exposes a topmost layer of the first semiconductor layers and does not expose side surfaces of the first and second semiconductor layers, and depositing a gate structure in the gate trench.

20 Claims, 20 Drawing Sheets

(51) Int. Cl.
  *H01L 23/00* (2006.01)
  *H01L 29/06* (2006.01)
  *H01L 29/66* (2006.01)
  *H01L 29/786* (2006.01)
(52) U.S. Cl.
  CPC .... *H01L 29/0673* (2013.01); *H01L 29/66545* (2013.01); *H01L 29/78696* (2013.01)
(58) Field of Classification Search
  CPC ......... H01L 29/78696; H01L 29/66439; H01L 29/165; H01L 29/7848; H01L 21/823481; H01L 23/564; H01L 29/41766; H01L 29/41775; H01L 23/585; H01L 27/088; H01L 29/775; B82Y 10/00
  See application file for complete search history.

(56) References Cited

U.S. PATENT DOCUMENTS

| | | | |
|---|---|---|---|
| 8,253,217 B2 | 8/2012 | Chen et al. | |
| 8,334,582 B2 | 12/2012 | Jeng et al. | |
| 8,395,239 B2 | 3/2013 | Chen et al. | |
| 8,461,021 B2 | 6/2013 | Yaung et al. | |
| 8,530,997 B1 | 9/2013 | Yang et al. | |
| 8,835,323 B1 | 9/2014 | Shieh et al. | |
| 9,093,308 B2 | 7/2015 | Yang et al. | |
| 9,245,842 B2 | 1/2016 | Chen et al. | |
| 9,437,739 B2 | 9/2016 | Yu et al. | |
| 9,443,838 B2 | 9/2016 | Yang et al. | |
| 9,946,827 B2 | 4/2018 | Wang et al. | |
| 10,229,889 B2 * | 3/2019 | Tatour | H01L 21/76892 |
| 10,366,956 B2 | 7/2019 | Yang et al. | |
| 10,373,865 B2 | 8/2019 | Yang et al. | |
| 11,201,106 B2 | 12/2021 | Chen et al. | |
| 2006/0055007 A1 * | 3/2006 | Yao | B28D 5/0011 |
| | | | 257/E21.546 |
| 2014/0327115 A1 | 11/2014 | Vu et al. | |
| 2018/0047680 A1 * | 2/2018 | Uchida | H01L 23/564 |
| 2018/0122751 A1 | 5/2018 | Chen et al. | |
| 2021/0296257 A1 * | 9/2021 | Wang | H01L 23/552 |
| 2021/0305381 A1 | 9/2021 | Chiang et al. | |
| 2021/0305408 A1 | 9/2021 | Yu et al. | |
| 2022/0051993 A1 | 2/2022 | Chen | |
| 2022/0302047 A1 * | 9/2022 | Chen | H01L 23/585 |

* cited by examiner

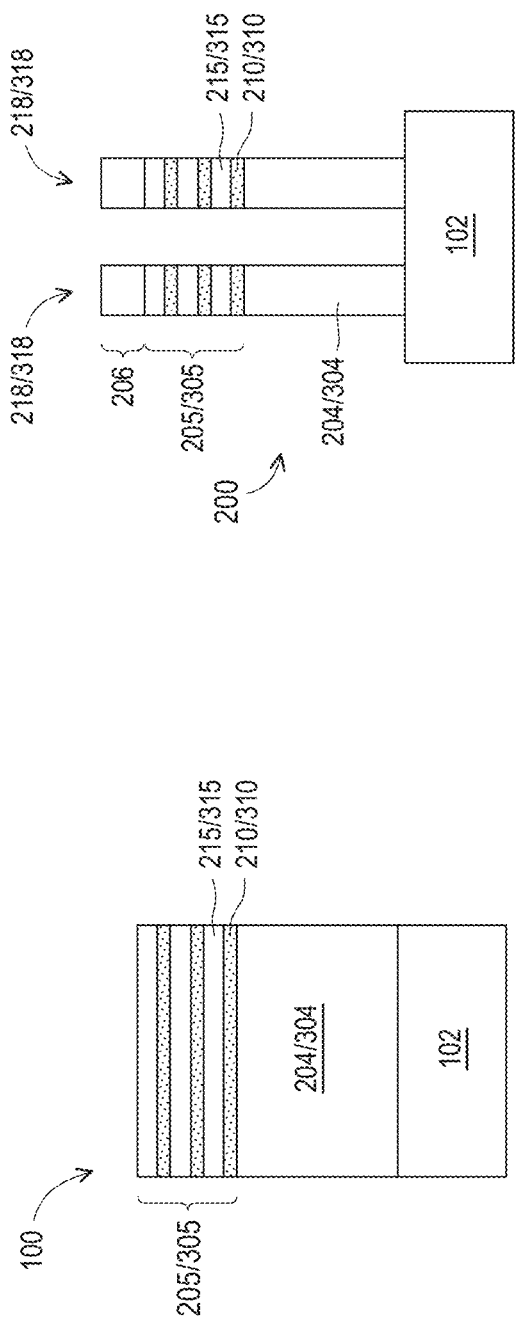

SEAL RING FOR SEMICONDUCTOR DEVICE

BACKGROUND

In semiconductor technologies, a semiconductor wafer is processed through various fabrication steps to form integrated circuits (IC). Typically, several circuits or IC dies are formed onto the same semiconductor wafer. The wafer is then diced to cut out the circuits formed thereon. To protect the circuits from moisture degradation, ionic contamination, and dicing processes, a seal ring is formed around each IC die. This seal ring is formed during fabrication of the many layers that comprise the circuits, including both the front-end-of-line (FEOL) processing and back-end-of-line processing (BEOL). The FEOL includes forming transistors, capacitors, diodes, and/or resistors onto the semiconductor substrate. The BEOL includes forming metal layer interconnects and vias that provide routing to the components of the FEOL.

Although existing seal ring structures and fabrication methods have been generally adequate for their intended purposes, improvements are desired. For example, it is desired to improve seal rings for protecting gate-all-around devices such as nanosheet devices.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 3A, 3B, 3C, 3D, 3E, 3F, 3G, 3H, 3I, 3J, 3K, 3L, and 3M are cross-sectional views of a semiconductor structure during fabrication stages according to an embodiment of the method of FIG. 2, according to aspects of the present disclosure.

DETAILED DESCRIPTION

Figure 1A:
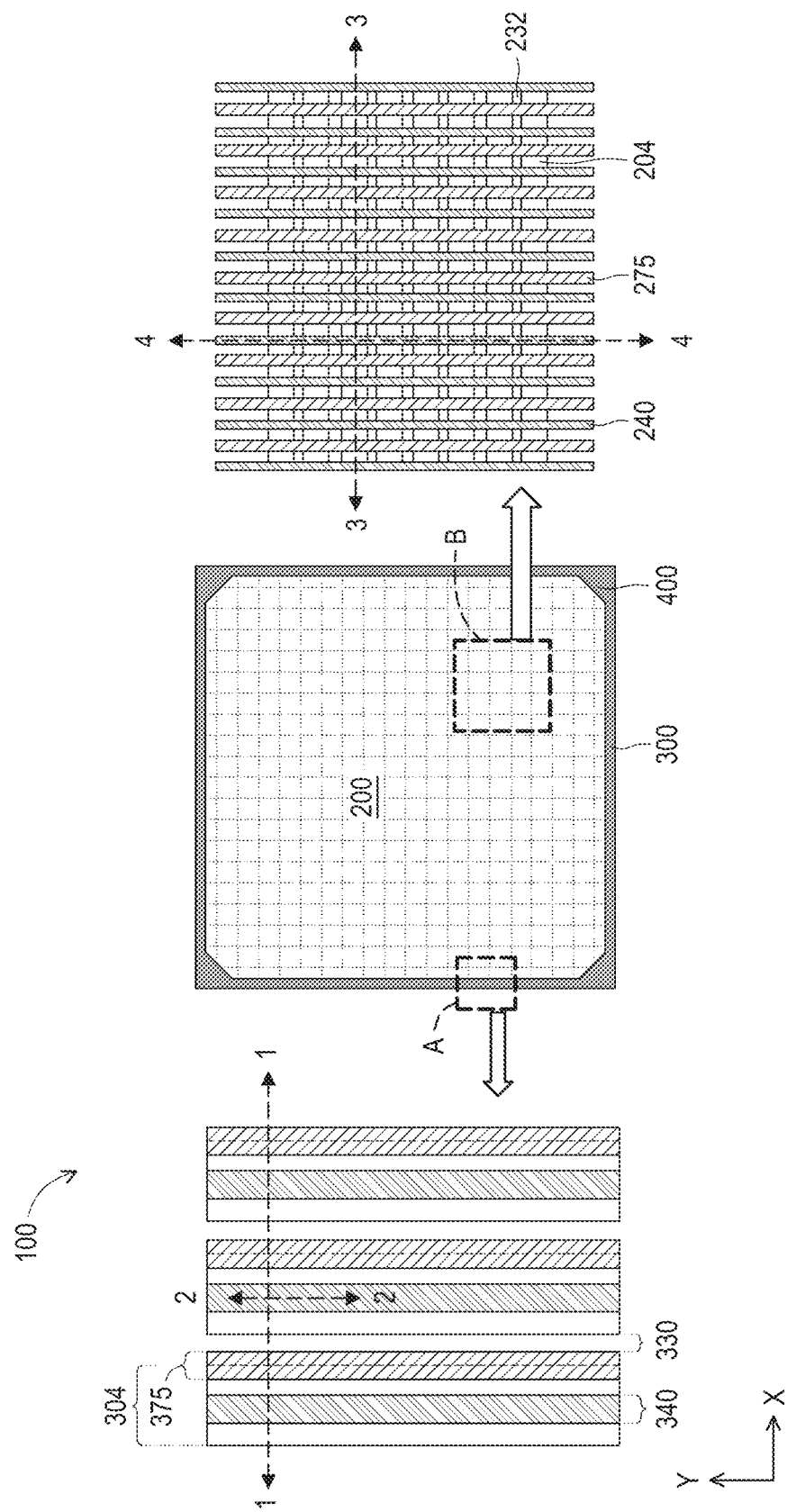
FIG. 1A is a top plan view of a semiconductor structure with a seal ring according to aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term encompasses numbers that are within certain variations (such as +/−10% or other variations) of the number described, in accordance with the knowledge of the skilled in the art in view of the specific technology disclosed herein, unless otherwise specified. For example, the term "about 5 nm" may encompass the dimension range from 4.5 nm to 5.5 nm, 4.0 nm to 5.0 nm, etc.

This application generally relates to semiconductor structures and fabrication processes, and more particularly to providing a seal ring that is compatible with a circuit region having gate-all-around (GAA) transistors. In other words, the seal ring surrounds one or more circuit dies that include GAA transistors. A GAA transistor (or GAA device) refers to a vertically-stacked horizontally-oriented multi-channel transistor, such as a nanowire transistor or a nanosheet transistor. GAA transistors are promising candidates to take CMOS to the next stage of the roadmap due to their better gate control ability, lower leakage current, and fully FinFET device layout compatibility. However, many challenges remain, one of which is how to make reliable seal rings that are compatible with the processes for making GAA transistors. An object of the present disclosure is to provide such seal rings.

According to an embodiment of the present disclosure, the seal ring is initially provided with stacked semiconductor layers (such as alternately stacked silicon and silicon germanium layers) and sacrificial gate structures (for example, polysilicon (or poly) gates) above the stacked semiconductor layers, just like in the GAA transistors prior to metal-gate replacement. Then, in subsequent fabrication stages, the poly gates in both the seal ring area and the die area are removed. Then, in the die area, the stacked semiconductor layers undergo a process referred to as "channel release" where some semiconductor layers are selectively removed, and other semiconductor layers remain as the transistor channels. At the same time, the stacked semiconductor layers in the seal ring are preserved and do not go through the channel release process. As a result, the alternately stacked semiconductor layers remain in the seal ring to make more stable and robust seal ring wall. Subsequently, high-k metal gates (HKMG) are formed in both the seal ring and the circuit die areas, followed by mid-end-of-line (MEOL) and back-end-of-line (BEOL) processes. Those of ordinary skill in the art should appreciate that they may readily use the present disclosure as a basis for designing or modifying other processes and structures for carrying out the same purposes and/or achieving the same advantages of the embodiments introduced herein.

FIG. 1A is a top plan view of the semiconductor structure 100 according to the present disclosure. The semiconductor structure 100 (such as a manufactured wafer or a part thereof) includes a seal ring 300 that encloses a circuit region (or IC die) 200. In embodiments, the semiconductor structure 100 may include other seal ring(s) enclosing the seal ring 300 or other seal ring(s) enclosed by the seal ring 300. Also, seal ring 300 may enclose other circuit region(s). The circuit region 200 may include any circuits, such as memory, processor, transmitter, receiver, and so on. The exact functionality of the circuit region 200 is not limited by the present disclosure. In the present disclosure, the circuit region 200 includes GAA transistors, which will be further discussed.

In the present embodiment, the seal ring 300 has a rectangular or substantially rectangular periphery and further includes four corner seal ring (CSR) structures 400 at the four interior corners of the rectangular or substantially rectangular periphery. In an embodiment, the CSR structure 400 is triangular or substantially triangular and provides various mechanical and structural benefits to the seal ring 300, such as preventing layer peeling at the corner of the chips during dicing processes. In other embodiments, the CSR structures 400 may be omitted in the seal ring 300. Further, the seal ring 300 may have non-rectangular shape. In the present embodiment, the seal ring 300 fully surrounds the circuit region 200. In other embodiments, the seal ring 300 may provide openings in selected locations in selected layers to allow interconnects between the circuit region 200 and other circuit regions not shown in FIG. 1A.

Referring to the zoomed-in view of the area B, the circuit region 200 includes semiconductor layers 204 and dummy fins 232 oriented lengthwise along the "x" direction, and further includes gate structures 240 and contacts 275 oriented lengthwise along the "y" direction. The above elements form a matrix, and transistors (such as GAA transistors) are formed in the intersections between the semiconductor layers 204 and the gate structures 240. Referring to the zoomed-in view of the area A, the seal ring 300 includes semiconductor layers 304, gate structures 340 and contact structures 375 disposed over the semiconductor layers 304, and isolation structures 330 between semiconductor layers 304. Each of the semiconductor layers 304, gate structures 340, EPI 360, contacts 375, and isolation structures 330 (as well as dummy fins 332 shown in FIG. 1B) forms a generally ring shape surrounding the circuit region 200. In this embodiment, the width of the gate structure 340 is narrow than the width of the semiconductor layer 304 from the top view. The gate structure 340 is disposed completely within the boundary of the semiconductor layer 304 from the top view, without extending to the isolation structures 330.

FIGS. 1B, 1C, 1D, and 1E are cross-sectional views of a portion of the semiconductor structure 100 along the "1-1," "2-2," "3-3," and "4-4" lines in FIG. 1A, respectively, according to aspects of the present disclosure. Referring to FIGS. 1B, 1C, 1D, and 1E collectively, the seal ring 300 and the circuit region 200 are formed on or in a substrate 102. The substrate 102 is a silicon substrate in the present embodiment. The substrate 102 may alternatively include other semiconductor materials in various embodiment, such as germanium, silicon carbide, gallium arsenide, gallium phosphide, indium phosphide, indium arsenide, indium antimonide, SiGe, GaAsP, AlInAs, AlGaAs, GaInAs, GaInP, GaInAsP, or combinations thereof. The substrate 102 may include doped semiconductor layers such as P-wells and/or N-wells. Furthermore, the substrate 102 may be a semiconductor on insulator substrate such as silicon on insulator (SOI) substrate.

Semiconductor layers 204 and 304 may include the same semiconductor material such as silicon, silicon germanium, germanium, or other suitable semiconductor materials. Further, semiconductor layers 204 and 304 may include N-type doped regions formed by doping the semiconductor material with n-type dopants, such as phosphorus, arsenic, other n-type dopant, or combinations thereof; and/or P-type doped regions formed by doping the semiconductor material with p-type dopants, such as boron, indium, other p-type dopant, or combinations thereof.

The semiconductor structure 100 further includes isolation structures 230 in the circuit region 200 and isolation structures 330 in the seal ring 300. The isolation structures 230 isolate the semiconductor layers 204 one from another. The isolation structures 330 isolate the semiconductor layers 304 one from another. In an embodiment, isolation structures 230 and 330 may be formed by the same process and include the same material. For example, isolation structures 230 and 330 may include silicon oxide, silicon nitride, silicon oxynitride, other suitable isolation material (for example, including silicon, oxygen, nitrogen, carbon, or other suitable isolation constituent), or combinations thereof. Isolation structures 230 and 330 may include shallow trench isolation (STI), deep trench isolation (DTI), or other types of isolation.

Figure 1B:
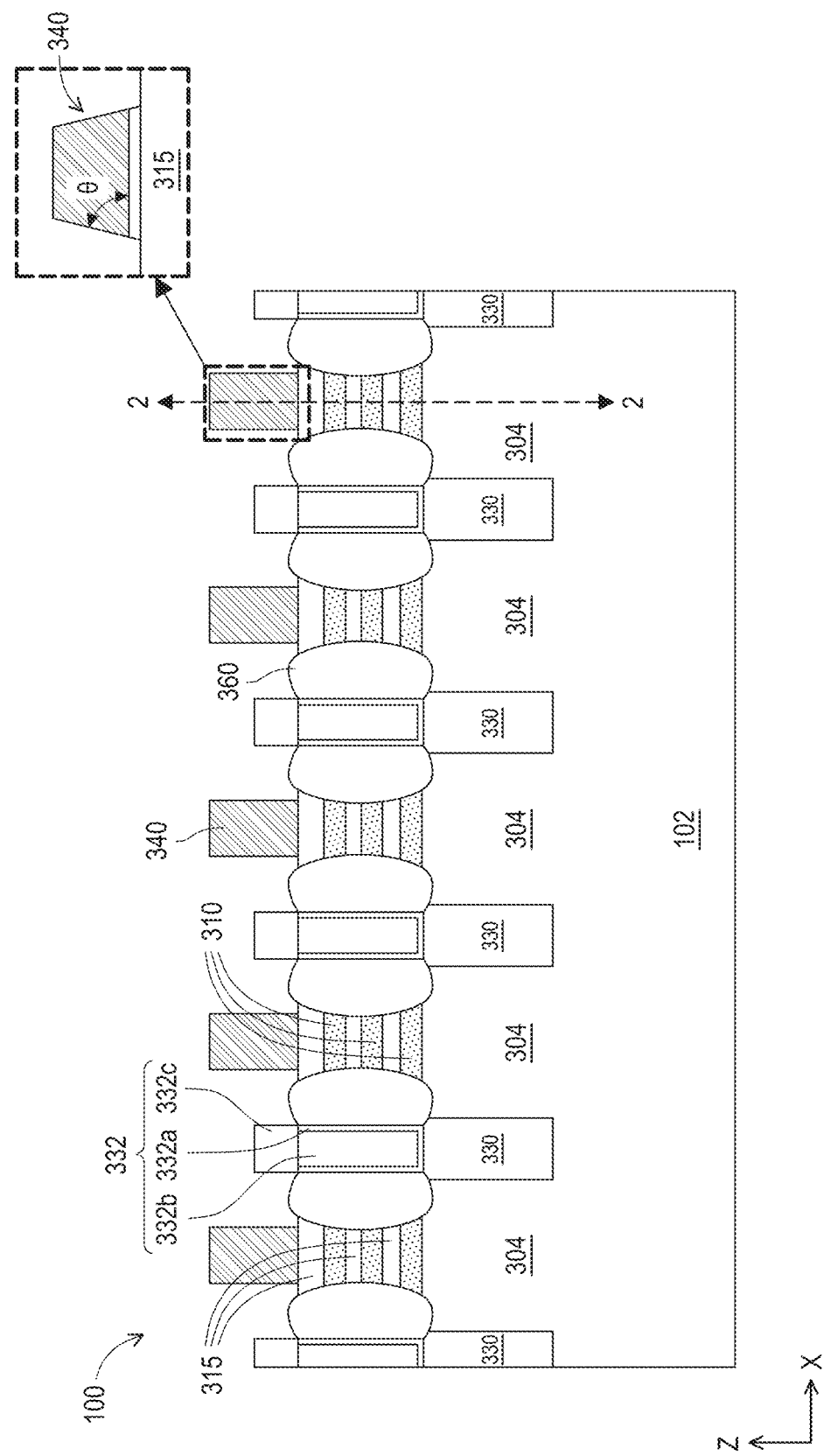
FIGS. 1B, 1C, 1D, and 1E are cross-sectional views of the semiconductor structure in FIG. 1A along the "1-1," "2-2," "3-3," and "4-4" lines in FIG. 1A, respectively, according to aspects of the present disclosure.
Figure 1C:
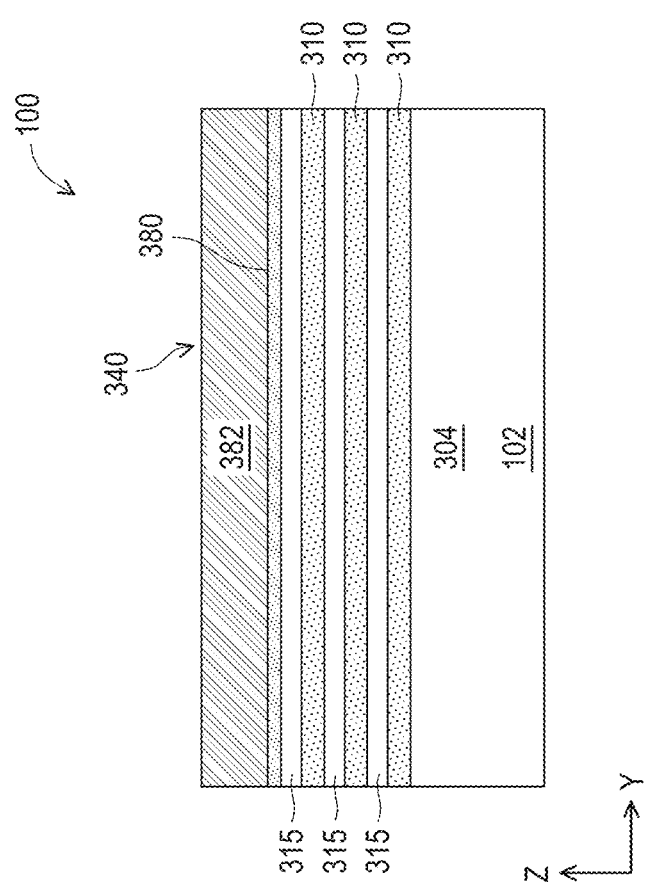
Figure 1D:
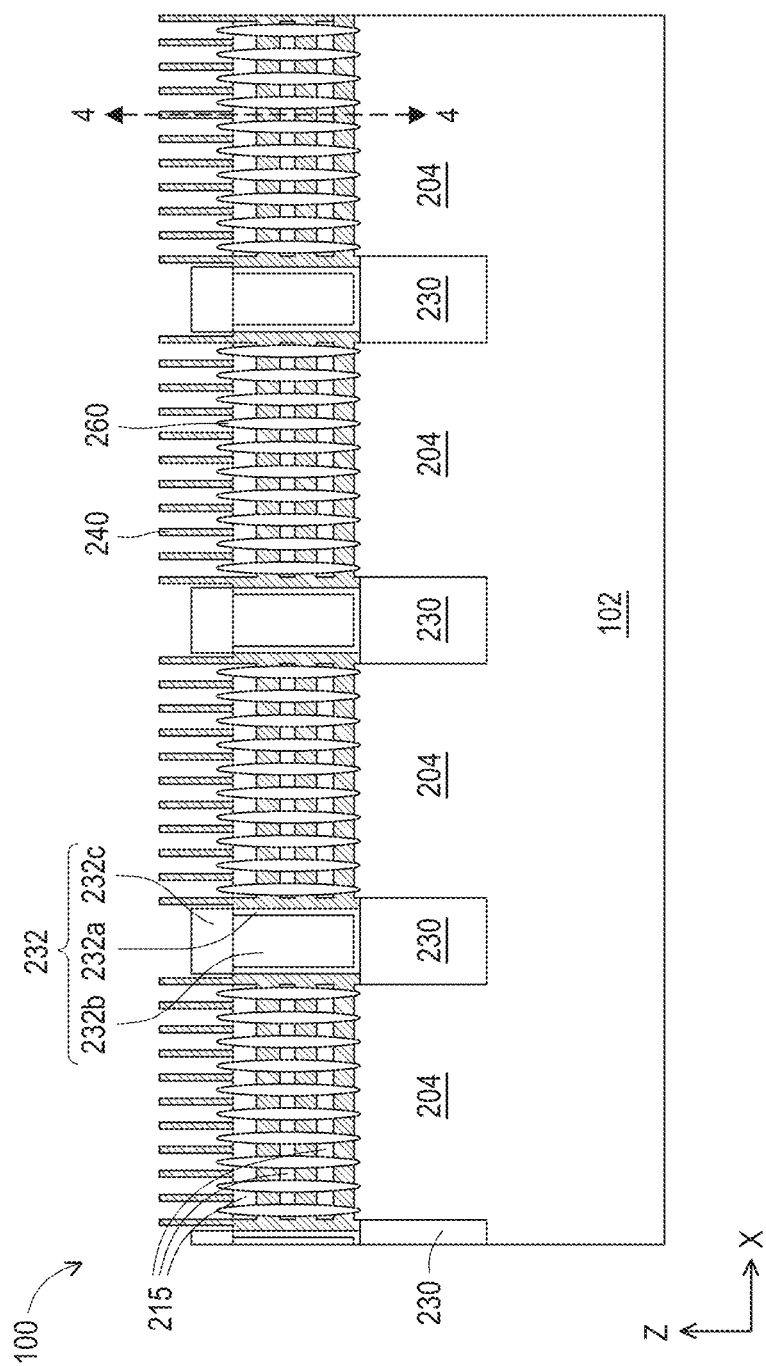
Figure 1E:
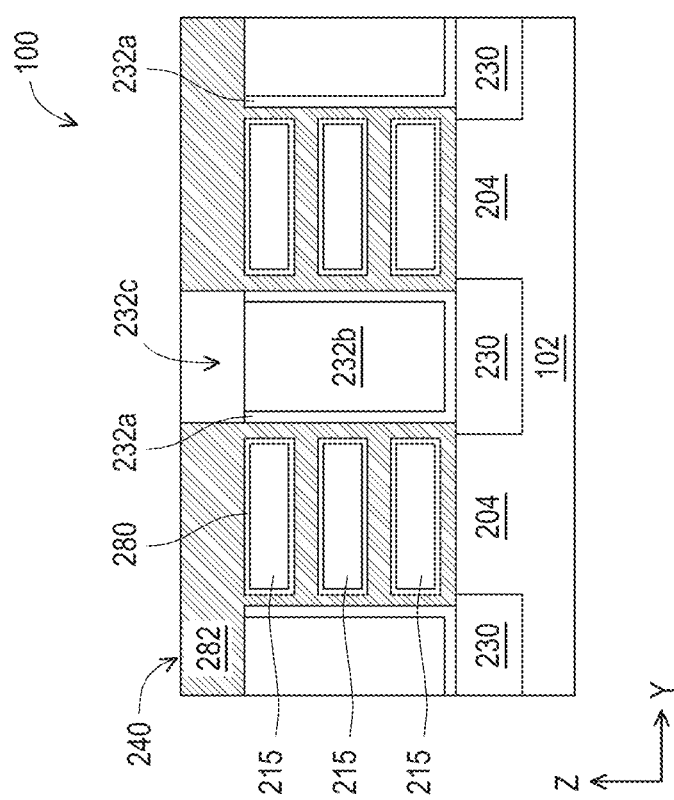

Referring to FIGS. 1B and 1C, the semiconductor structure 100 further includes a stack of semiconductor layers 310 and 315 in the seal ring 300. The semiconductor layers 310 and 315 are stacked vertically (along the z-direction) in an interleaving or alternating configuration from a surface of the substrate 102. Referring to FIGS. 1D and 1E, the semiconductor structure 100 further includes a stack of semiconductor layers 215 in the circuit region 200. The semiconductor layers 215 are suspended vertically (along the z-direction) from a surface of the substrate 102. In an embodiment, the semiconductor structure 100 initially includes a stack of semiconductor layers 210 (not shown in FIGS. 1D and 1E but shown in FIGS. 3A and 3B) and 215 in the circuit region 200, like the semiconductor layers 310 and 315 in the seal ring 300. Then, the semiconductor layers 210 are subsequently removed, which will be further discussed.

A composition of semiconductor layers 310 (and 210) is different than a composition of semiconductor layers 315 and 215 to achieve etch selectivity. For example, semiconductor layers 310 (and 210) include silicon germanium and semiconductor layers 315 and 215 include silicon. In some embodiments, semiconductor layers 310 (and 210) and semiconductor layers 315 and 215 can include the same material but with different constituent atomic percentages. For example, semiconductor layers 310 (and 210) and semiconductor layers 315 and 215 can include silicon germanium, where semiconductor layers 310 (and 210) have a first silicon atomic percent and/or a first germanium atomic percent and semiconductor layers 315 and 215 have a second, different silicon atomic percent and/or a second, different germanium atomic percent. The present disclosure contemplates that semiconductor layers 310 (and 210) and semiconductor layers 315 and 215 include any combination of semiconductor materials that can provide desired etching selectivity, desired oxidation rate differences, and/or desired performance characteristics (e.g., materials that maximize current flow), including any of the semiconductor materials disclosed herein.

Referring to FIGS. 1B and 1D, the semiconductor structure 100 further includes epitaxially grown semiconductor layers (EPI) 360 in seal ring 300 and EPI 260 in circuit region 200. For n-type transistors, EPI 260 may include silicon and can be doped with carbon, phosphorous, arsenic, other n-type dopant, or combinations thereof (for example, forming Si:C epitaxial source/drain features, Si:P epitaxial source/drain features, or Si:C:P epitaxial source/drain features). For p-type transistors, EPI 260 may include silicon germanium or germanium and can be doped with boron, other p-type dopant, or combinations thereof (for example, forming Si:Ge:B epitaxial source/drain features). EPI 360 may include the same material as EPI 260.

Referring to FIGS. 1B, 1D, and 1E, the semiconductor structure 100 further includes dummy fins (or isolation fins) 232 in circuit region 200 and dummy fins (or isolation fins) 332 in seal ring 300. The dummy fins 232 and 332 are disposed over the isolation structures 230 and 330, respectively. Each of the dummy fins 232 and 332 is a multi-layered structure. In the present embodiment, dummy fin 232 includes dielectric layers 232a, 232b, and 232c; and dummy fin 332 includes dielectric layers 332a, 332b, and 332c. The dummy fins 232 and 332 may be formed by the same process and include the same materials. Dielectric layers 232a and 332a may include a low-k dielectric material such as a dielectric material including Si, O, N, and C. Low-k dielectric material generally refers to dielectric materials having a low dielectric constant, for example, lower than that of silicon oxide (k≈3.9). Dielectric layers 232b and 332b may include silicon oxide, silicon nitride, silicon oxynitride, TEOS formed oxide, PSG, BPSG, low-k dielectric material, other suitable dielectric material, or combinations thereof. Dielectric layers 232c and 332c may include a high-k dielectric material, such as $HfO_2$, HfSiO, $HfSiO_4$, HfSiON, HfLaO, HfTaO, HfTiO, HfZrO, $HfAlO_x$, ZrO, $ZrO_2$, $ZrSiO_2$, AlO, AlSiO, $Al_2O_3$, TiO, $TiO_2$, LaO, LaSiO, $Ta_2O_3$, $Ta_2O_5$, $Y_2O_3$, $SrTiO_3$, BaZrO, $BaTiO_3$ (BTO), (Ba, Sr)$TiO_3$ (BST), $Si_3N_4$, hafnium dioxide-alumina ($HfO_2$—$Al_2O_3$) alloy, other suitable high-k dielectric material, or combinations thereof. High-k dielectric material generally refers to dielectric materials having a high dielectric constant, for example, greater than that of silicon oxide (k≈3.9). Dummy fins 232 and isolation structures 230 collectively separate semiconductor layers 204, semiconductor layers 215, and EPI 260 along the "x" direction (FIG. 1D) and the "y" direction (FIG. 1E). In the portion of the semiconductor structure shown in the area B in FIG. 1A, the dummy fins 232 are shown as oriented lengthwise along the "x" direction, and dummy fins 232 oriented lengthwise along the "y" direction also exist, although not shown.

Referring to FIGS. 1B, 1C, 1D, and 1E, the semiconductor structure 100 further includes gate structures 240 and 340 in circuit regions 200 and seal ring 300, respectively. Gate structure 240 includes gate dielectric layer 280 and gate electrode 282 over the gate dielectric layer 280. Gate structure 240 wraps around the semiconductor layers 215 (FIGS. 1D and 1E) to form gate-all-around transistors. Dummy fins 232 separate some of the gate structures 240 along the "y" direction. Gate structure 340 includes gate dielectric layer 380 and gate electrode 382 over the gate dielectric layer 380. Gate structure 340 is disposed above the topmost layer in the stack of semiconductor layers 315 and 310 and does not wrap around the semiconductor layers 315 and 310. The stack of semiconductor layers 315 and 310 provide stable and robust structure for the seal ring 300. Gate structure 340 forms a continuous ring shape (see FIG. 1A). As the depicted embodiment in FIG. 1A, the gate structure 340 is disposed completely within the boundary of the top surface of the topmost layer in the stack of semiconductor layers 315 and 310 from the top view, without extending to the isolation structures 330, dummy fins 332, or the EPI 360 from the top view. Gate structure 340 may have a tapered profile (i.e., having tapered sidewalls) where its sidewall may form an angle θ with the top surface of the topmost layer in the stack of semiconductor layers 315 and 310. In some embodiment, the angle may be in a range of about 88 degrees to about 90 degrees. In the present embodiment, gate structures 240 and 340 each includes a high-k metal gate. For example, the gate dielectric layers 280 and 380 may include a high-k gate dielectric material while the gate electrodes 282 and 382 may include a metal electrode. The semiconductor structure 100 includes other components not discussed above and not shown in FIGS. 1A-1E, such as inner spacers, gate spacers, etch stop layer, contacts, interlayer dielectric layer, some of which will be further discussed below.

As shown in FIGS. 1A-1E, the semiconductor structure 100 includes substrate 102 with circuit region 200 and seal ring 300 thereover. The circuit region 200 includes EPI 260 which serve as source/drain structures of GAA transistors. The circuit region 200 includes semiconductor layers 210 connecting EPI 260 and serving as channels of GAA transistors. The circuit region 200 includes gate structures 240 disposed between the EPI 260 and wrapping around each of the semiconductor layers 210. The seal ring 300 includes multiple EPI 360, semiconductor layers 310 and 315 alternately stacked one over another, and gate structures 340 over the topmost layer of the semiconductor layers 310 and 315. The semiconductor layers 310 and 315 include different materials or different compositions. In an embodiment, each EPI 360 forms a continuous ring that surrounds the circuit region 200 from a top view. Further, each gate structure 340 also forms a continuous ring that surrounds the circuit region 200 from the top view. The seal ring 300 further includes isolation structures 330 and dummy fins 332 that form continuous rings from a top view, wherein the gate structure 340 and the EPI 360 are disposed between the isolation structures 330 and dummy fins 332 from a top view. Further, the gate structure 340 does not overlap with the isolation structures 330 or dummy fins 332 from the top view.

Figure 2:
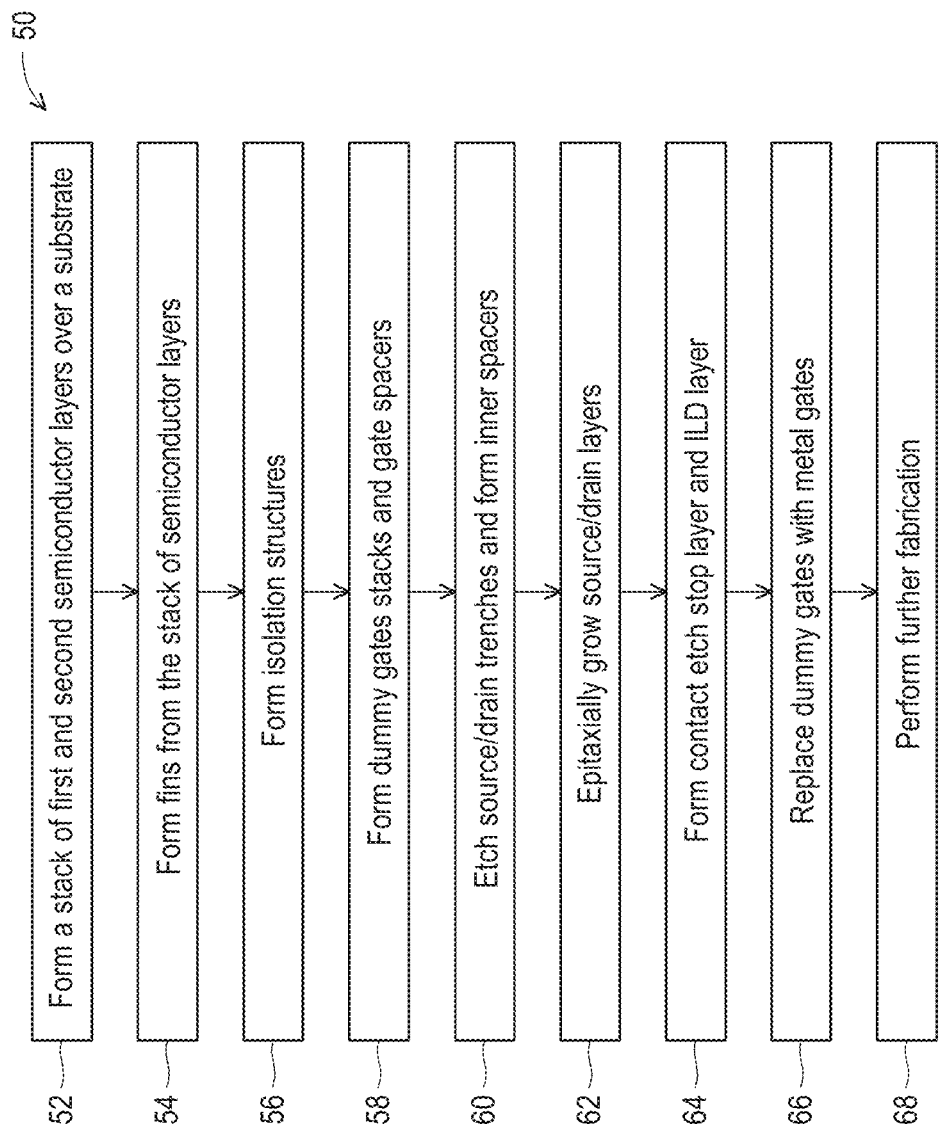
FIG. 2 is a flow chart of a method of making the semiconductor structures in FIGS. 1A, 4A, and 7.

FIG. 2 is a flow chart of a method 50 for fabricating the semiconductor structure 100 according to various aspects of the present disclosure. Additional processing is contemplated by the present disclosure. Additional operations can be provided before, during, and after method 50, and some of the operations described can be moved, replaced, or eliminated for additional embodiments of method 50. Method 50 is described below in conjunction with FIGS. 3A-3L that illustrate various cross-sectional views of the semiconductor structure 100 at various steps of fabrication according to the method 50, in accordance with some embodiments.

At operation 52, the method 50 (FIG. 2) forms a stack 205 of semiconductor layers 210 and 215 over a semiconductor layer 204 over a substrate 102 and forms a stack 305 of semiconductor layers 310 and 315 over a semiconductor layer 304 over the substrate 102, such as shown in FIG. 3A according to an embodiment. The stack 205 is formed in the circuit region 200, and the stack 305 is formed in the seal ring 300. The semiconductor layers 310 and 315 are the same as the semiconductor layers 210 and 215, respectively, just in different regions of the semiconductor structure 100. In some embodiments, semiconductor layers 210/310 and semiconductor layers 215/315 are epitaxially grown in the depicted interleaving and alternating configuration. The number of semiconductor layers 210/310 (and the number of semiconductor layers 215/315) may range from 2 to 10 in some embodiments. Semiconductor layers 210/310 and semiconductor layers 215/315 include different materials, constituent atomic percentages, constituent weight percentages, thicknesses, and/or characteristics to achieve desired etching selectivity during an etching process (referred to as channel release process) that will be further discussed.

At operation 54, the method 50 (FIG. 2) forms fins 218 by patterning the stack of semiconductor layers 215/210 and the semiconductor layers 204, and forms fins 318 by patterning the stack of semiconductor layers 315/310 and the semiconductor layers 304. The fins 218 are oriented lengthwise along the "x" direction (see FIG. 1A), which is the direction into and out of the page of FIG. 3B. The fins 318 are formed into rings that surround the circuit region 200. As illustrated in FIG. 3B, the fins 218 include the patterned stack 205 (having semiconductor layers 210 and 215), patterned regions 204, and one or more patterned hard mask layers 206; and the fins 318 include the patterned stack 305 (having semiconductor layers 310 and 315), patterned regions 304, and one or more patterned hard mask layers 206. The fins 218 and 318 may be patterned by any suitable method. For example, the fins 218 and 318 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over the stacks 205/305 and patterned using a photolithography process. Spacers are formed alongside the patterned sacrificial layer using a self-aligned process. The sacrificial layer is then removed, and the remaining spacers, or mandrels, may then be used as a masking element for patterning the fins 218/318. For example, the masking element may be used for etching recesses into the stacks 205/305, the semiconductor layers 204/304, and the substrate 102, leaving the fins 218/318 on the substrate 102. The etching process may include dry etching, wet etching, reactive ion etching (RIE), and/or other suitable processes.

At operation 56, the method 50 (FIG. 2) forms isolation structures 230 and dummy fins 232 in the circuit region 200 and forms isolation structures 330 and dummy fins 332 in the seal ring 300. This may involve a variety of processes, such as shown in FIGS. 3C-3E.

Figure 3D:
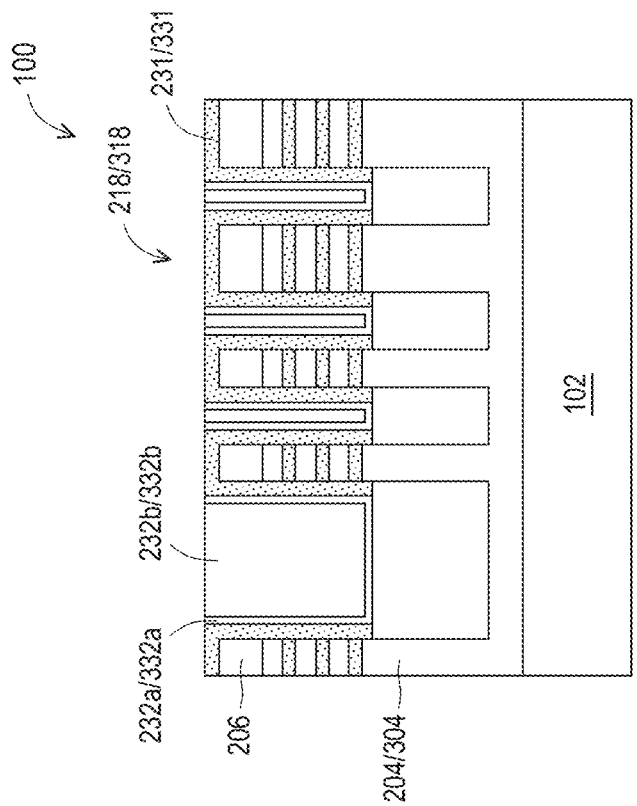
Figure 3C:
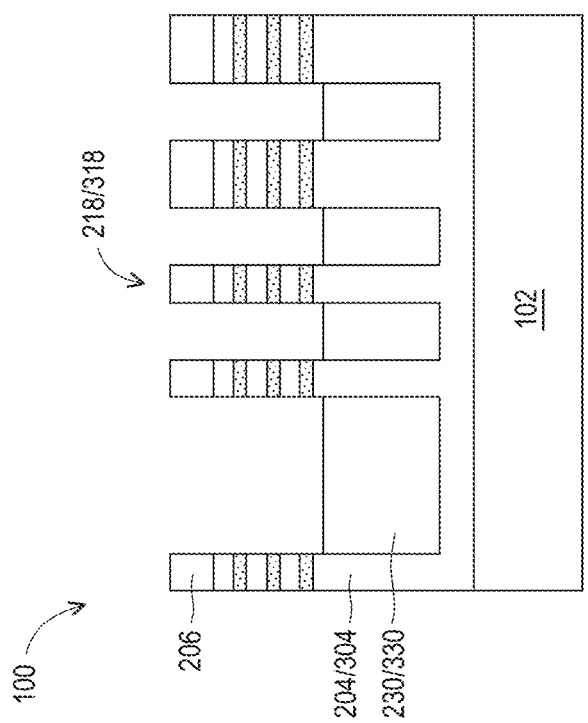

Referring to FIG. 3C, in an embodiment, the isolation structures 230/330 can be formed by filling the trenches between fins 218/318 with insulator material (for example, by using a CVD process or a spin-on glass process), performing a chemical mechanical polishing (CMP) process to remove excessive insulator material and/or planarize a top surface of the insulator material layer, and etching back the insulator material layer to form isolation structures 230/330.

Referring to FIG. 3D, a cladding layer 231 is formed on top and sidewalls of the fins 218, and a cladding layer 331 is formed on top and sidewalls of the fins 318. In an embodiment, the cladding layers 231 and 331 may include the same material and be formed using the same process. For example, the cladding layer 231/331 may include SiGe and may be deposited using CVD, physical vapor deposition (PVD), atomic layer deposition (ALD), high density plasma CVD (HDPCVD), metal organic CVD (MOCVD), remote plasma CVD (RPCVD), plasma enhanced CVD (PECVD), low-pressure CVD (LPCVD), atomic layer CVD (ALCVD), atmospheric pressure CVD (APCVD), other suitable methods, or combinations thereof. Still referring to FIG. 3D, dielectric layers 232$a$ and 232$b$ are formed in the circuit region 200, and dielectric layers 332$a$ and 332$b$ are formed in the seal ring 300. The dielectric layers 232$a$ and 332$a$ may include the same material and be formed using the same process. The dielectric layers 232$b$ and 332$b$ may include the same material and be formed using the same process. The dielectric layers 232$a$/332$a$ may be deposited using CVD, PVD, ALD, HDPCVD, MOCVD, RPCVD, PECVD, LPCVD, ALCVD, APCVD, other suitable methods, or combinations thereof. The dielectric layers 232$b$/332$b$ may be deposited using a flowable CVD (FCVD) process or other types of methods. After the layers 232$a$/332$a$ and 232$b$/332$b$ are deposited, the operation 56 may perform a CMP process to planarize the top surface of the semiconductor structure 100 and to expose the cladding layer 231 and 331.

Figures 3E, 3F:
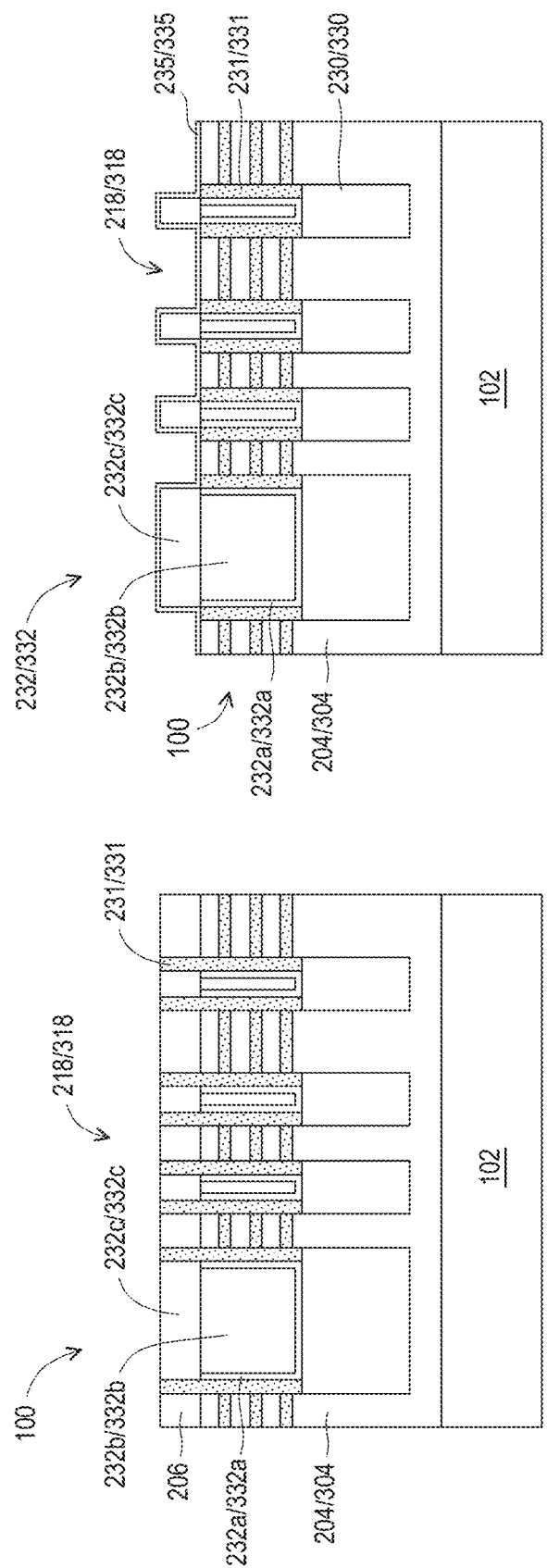

Referring to FIG. 3E, the operation 56 recesses the dielectric layers 232$b$/332$b$ and 232$a$/332$a$ using a selective etching process that etches the dielectric layers 232$b$/332$b$ and 232$a$/332$a$ with no (or minimal) etching to the hard mask 206 and the cladding layer 231. Then, the operation 56 deposits one or more dielectric materials into the recesses and performs a CMP process to the one or more dielectric materials to form the dielectric layer 232$c$ in the circuit region 200 and the dielectric layer 332$c$ in the seal ring 300. In an embodiment, the dielectric layers 232$c$/332$c$ include a high-k dielectric material, such as $HfO_2$, HfSiO, $HfSiO_4$, HfSiON, HfLaO, HfTaO, HfTiO, HfZrO, $HfAlO_x$, ZrO, $ZrO_2$, $ZrSiO_2$, AlO, AlSiO, $Al_2O_3$, TiO, $TiO_2$, LaO, LaSiO, $Ta_2O_3$, $Ta_2O_5$, $Y_2O_3$, $SrTiO_3$, BaZrO, $BaTiO_3$ (BTO), (Ba,Sr)$TiO_3$ (BST), $Si_3N_4$, hafnium dioxide-alumina ($HfO_2$—$Al_2O_3$) alloy, other suitable high-k dielectric material, or combinations thereof.

At operation 58, the method 50 (FIG. 2) forms dummy gate structures 240' in the circuit region 200 and forms dummy gate structures 340' in the seal ring 300. This may involve a variety of processes, such as shown in FIGS. 3F-3G.

Referring to FIG. 3F, operation 58 recesses the fins 218 and 318 (particularly, removing the hard mask layer 206) and the cladding layer 231 and 331 that are disposed between the dielectric layers 232$c$ and 332$c$, respectively. Then, operation 58 deposits a dielectric layer 235 in the circuit region 200 and a dielectric layer 335 in the seal ring 300. The dielectric layers 235 and 335 may include the same material and be formed using the same process. In the present embodiment, dielectric layers 235/335 are dummy (or sacrificial) gate dielectric layers and may include silicon oxide, a high-k dielectric material, other suitable dielectric material, or combinations thereof. Dielectric layers 235/335 may be deposited using any of the processes described herein, such as ALD, CVD, PVD, other suitable process, or combinations thereof.

Figure 3G:
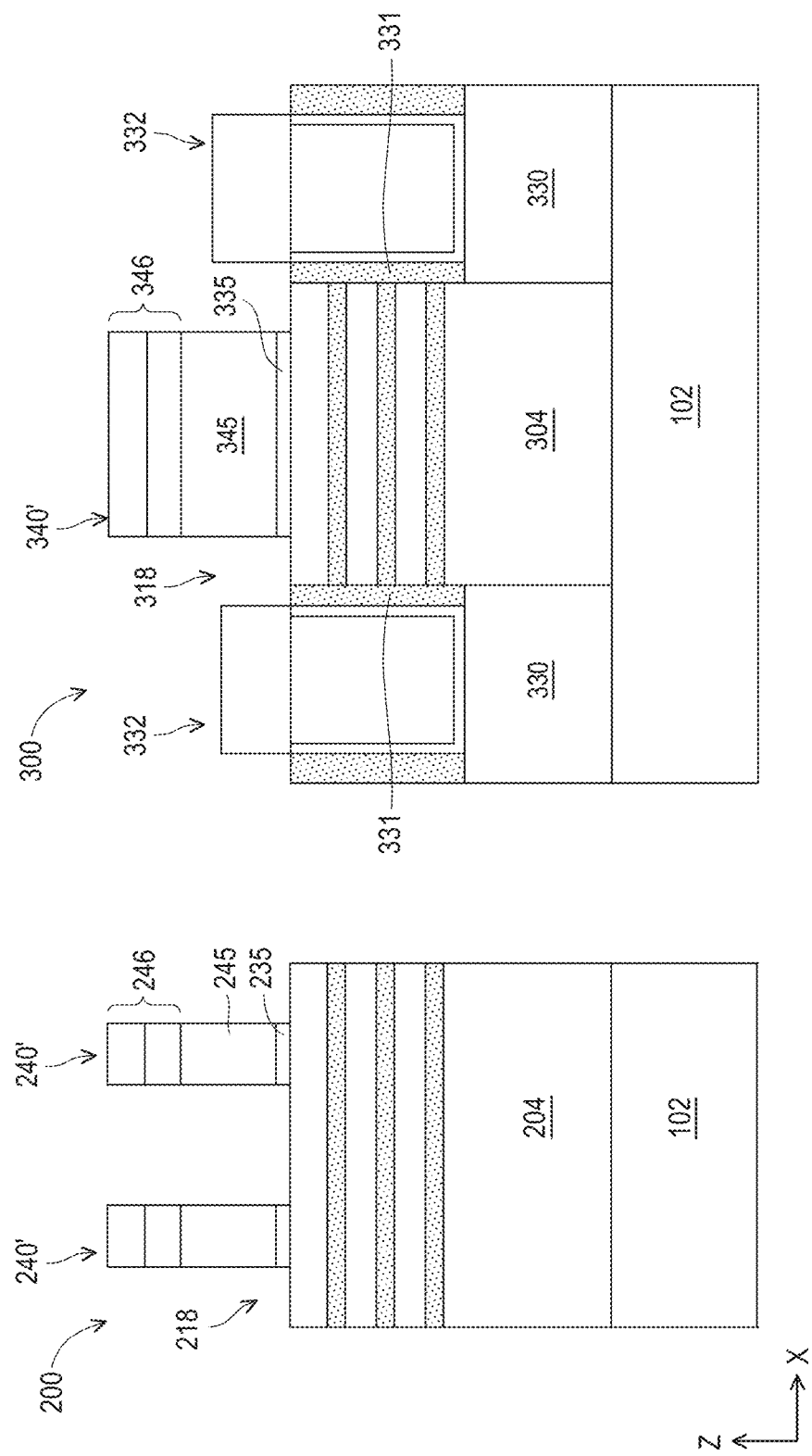

Referring to FIG. 3G, operation 58 deposits a dummy gate layer 245 over the dummy gate dielectric layer 235 in the circuit region 200 and deposits a dummy gate layer 345 over the dielectric layer 335 in the seal ring 300. The dummy gate layers 245 and 345 may include the same material and be formed using the same process. In an embodiment, dummy gate layers 245 and 345 include polysilicon (or poly). Then, operation 58 forms a hard mask layer 246 in the circuit region 200 and a hard mask layer 346 in the seal ring 300. The hard mask layers 246 and 346 may include the same material and be formed using the same process. Then, operation 58 performs lithography patterning and etching processes to pattern the hard mask layers 246/346, the dummy gate layers 245/345, and the dummy gate dielectric layers 235/335 to form dummy gate structures 240' in the circuit region 200 and dummy gate structures 340' in the seal ring 300. Dummy gate structure 240' includes portions of the hard mask layer 246, portions of the dummy gate layer 245, and portions of the dummy gate dielectric layer 235. Dummy gate structure 340' includes portions of the hard mask layer 346, portions of the dummy gate layer 345, and portions of the dummy gate dielectric layer 335. Dummy gate structures 240' are formed into lines that are oriented lengthwise along the "y" direction (see FIG. 1A), which is the direction into and out of the page of FIG. 3G. In other words, the dummy gate structures 240' are formed to traverse (or be perpendicular to) the fins 218 from the top view. Dummy gate structures 340' are formed into rings that surround the circuit region 200 from a top view (see FIG. 1A). Particularly, each dummy gate structure 340' is formed to be narrower than the underlying fin 318 and does not extend to the dummy fins 332 on both sides of the fin 318.

Figure 3H:
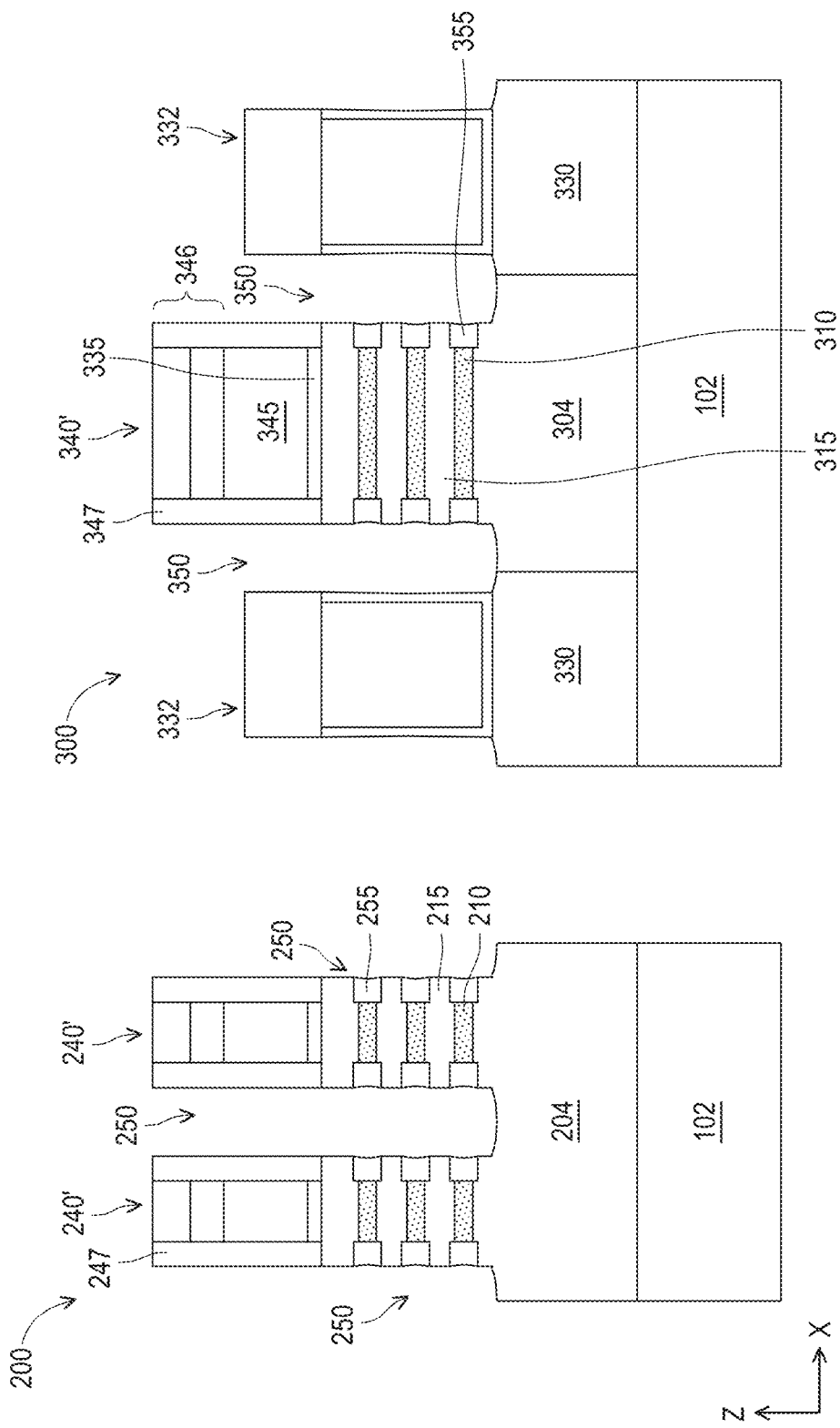

Operation 58 may further form gate spacers 247 on sidewalls of dummy gate structures 240' and gate spacers 347 on sidewalls of dummy gate structures 340' (as shown in FIG. 3H). Gate spacers 247 and 347 are formed by any suitable process and include a dielectric material. The dielectric material can include silicon, oxygen, carbon, nitrogen, other suitable material, or combinations thereof (e.g., silicon oxide, silicon nitride, silicon oxynitride (SiON), silicon carbide, silicon carbon nitride (SiCN), silicon oxycarbide (SiOC), silicon oxycarbon nitride (SiOCN)). For example, a dielectric layer including silicon and nitrogen, such as a silicon nitride layer, can be deposited over dummy gate structures 240' and 340' and subsequently etched (e.g., anisotropically etched) to form gate spacers 247 and 347. In some embodiments, gate spacers 247 and 347 include a multi-layer structure, such as a first dielectric layer that includes silicon nitride and a second dielectric layer that includes silicon oxide.

At operation 60, the method 50 (FIG. 2) forms source/drain (S/D) trenches 250 by etching the fins 218 adjacent the gate spacers 247 and forms source/drain (S/D) trenches 350 by etching the fins 318 adjacent the gate spacers 347, such as shown in FIG. 3H. For example, one or more etching processes are used to remove semiconductor layers 210 and 215 in source/drain regions of fins 218 and to remove semiconductor layers 310 and 315 in certain regions of fins 318. The etching of the semiconductor layers 310 and 315 are self-aligned to the dummy fins 332, gate spacers 347, and dummy gate structures 340'. In some embodiments, the etching process removes some, but not all, of semiconductor layers 210, 215, 310, and 315. The etching process can include a dry etching process, a wet etching process, other suitable etching process, or combinations thereof.

Operation 60 further forms inner spacers 255 in the circuit region 200 and inner spacers 355 in seal ring 300, such as shown in FIG. 3H. For example, a first etching process is performed that selectively etches semiconductor layers 210 exposed by source/drain trenches 250 with minimal (to no) etching of semiconductor layers 215, such that gaps are formed between semiconductor layers 215 and between semiconductor layers 215 and semiconductor layer 204 under gate spacers 247. At the same time, the first etching process selectively etches semiconductor layers 310 exposed by trenches 350 with minimal (to no) etching of semiconductor layers 315, such that gaps are formed between semiconductor layers 315 and between semiconductor layers 315 and semiconductor layer 304 under gate spacers 347. The first etching process is configured to laterally etch (e.g., along the "x" direction) semiconductor layers 210/310, thereby reducing a length of semiconductor layers 210/310 along the "x" direction. The first etching process is a dry etching process, a wet etching process, other suitable etching process, or combinations thereof. A deposition process then forms a spacer layer in the trenches 250/350. The deposition process is configured to ensure that the spacer layer fills the gaps discussed above. A second etching process is then performed that selectively etches the spacer layer to form inner spacers 255 and 355 as depicted in FIG. 3H with minimal (to no) etching of other material layers. In some embodiments, the spacer layer 255/355 includes a dielectric material that includes silicon, oxygen, carbon, nitrogen, other suitable material, or combinations thereof (for example, silicon oxide, silicon nitride, silicon oxynitride, silicon carbide, or silicon oxycarbonitride). In some embodiments, the spacer layer 255/355 includes a low-k dielectric material, such as those described herein.

Figure 3I:
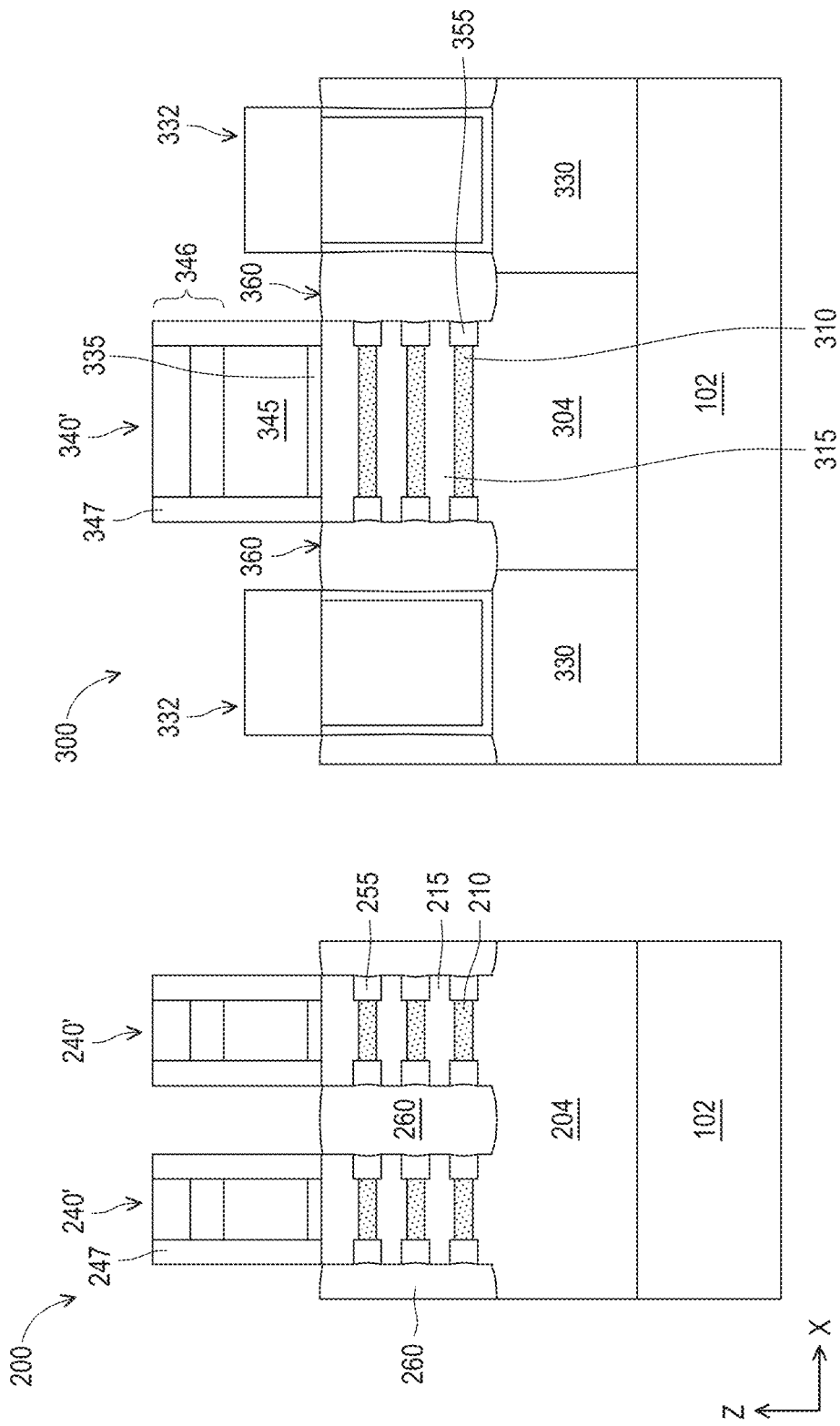

At operation 62, the method 50 (FIG. 2) epitaxially grows semiconductor layers 260 in the S/D trenches 250 and epitaxially grows semiconductor layers 360 in the trenches 350, such as shown in FIG. 3I. The semiconductor layers 260 and 360 are also referred to as EPI 260 and 360, respectively. An epitaxy process can use CVD deposition techniques (for example, VPE and/or UHV-CVD), molecular beam epitaxy, other suitable epitaxial growth processes, or combinations thereof. The epitaxy process can use gaseous and/or liquid precursors, which interact with the composition of the semiconductor layers 204, 215, 304, and 315. EPI 260 and 360 may be doped with n-type dopants or p-type dopants for n-type transistors or p-type transistors respectively. In some embodiments, EPI 260 and 360 may include silicon and can be doped with carbon, phosphorous, arsenic, other n-type dopant, or combinations thereof. In some embodiments, EPI 260 and 360 may include silicon germanium or germanium and can be doped with boron, other p-type dopant, or combinations thereof. In some embodiments, EPI 260 and 360 include more than one epitaxial semiconductor layer.

Figure 3J:
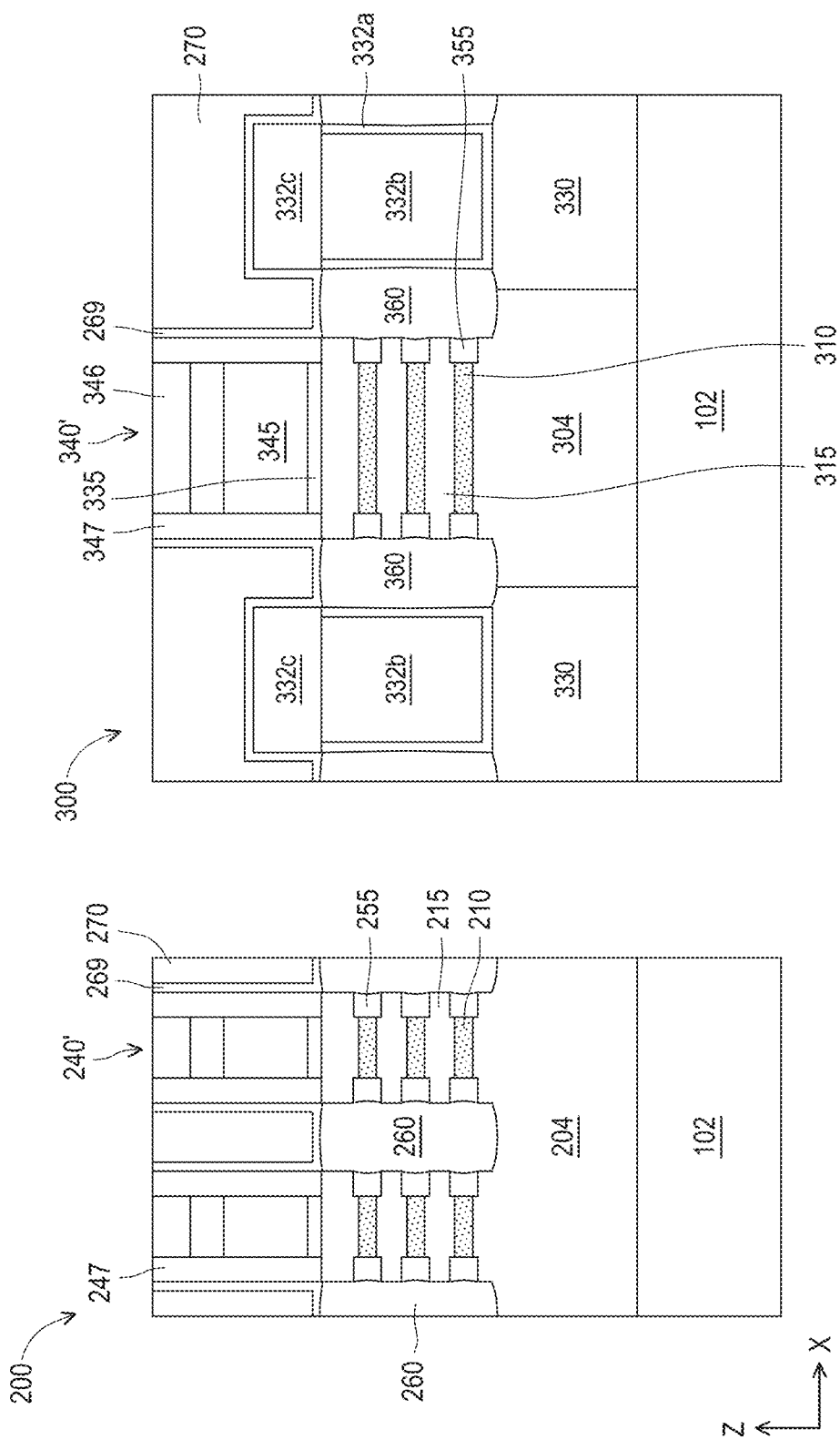

At operation 64, the method 50 (FIG. 2) forms a contact etch stop layer (CESL) 269 and an inter-layer dielectric (ILD) layer 270, such as shown in FIG. 3J. The CESL 269 is deposited over the dummy fins 232, 332 and EPI 260, 360, and on sidewalls of the gate spacers 247 and 347. The ILD layer 270 is deposited over the CESL 269 and fills the space between opposing gate spacers 247/347. The CESL 269 includes a material that is different than ILD layer 270 and different than the dielectric layer 232c/332c. The CESL 269 may include $La_2O_3$, $Al_2O_3$, SiOCN, SiOC, SiCN, $SiO_2$, SiC, ZnO, ZrN, $Zr_2Al_3O_9$, $TiO_2$, $TaO_2$, $ZrO_2$, $HfO_2$, $Si_3N_4$, $Y_2O_3$, AlON, TaCN, ZrSi, or other suitable material(s); and may be formed by CVD, PVD, ALD, or other suitable methods. The ILD layer 270 may comprise tetraethylorthosilicate (TEOS) formed oxide, un-doped silicate glass, or doped silicon oxide such as borophosphosilicate glass (BPSG), fluoride-doped silica glass (FSG), phosphosilicate glass (PSG), boron doped silicon glass (BSG), a low-k dielectric material, other suitable dielectric material, or combinations thereof. The ILD 270 may be formed by PECVD (plasma enhanced CVD), FCVD (flowable CVD), or other suitable methods. Subsequent to the deposition of the CESL 269 and the ILD layer 270, a CMP process and/or other planarization process can be performed until reaching (exposing) a top portion (or top surface) of dummy gate structures 240', 340'. In some embodiments, the planarization process removes hard mask layers 246, 346 of dummy gate structures 240', 340' to expose underlying dummy gate layers 245, 345.

Figure 3K:
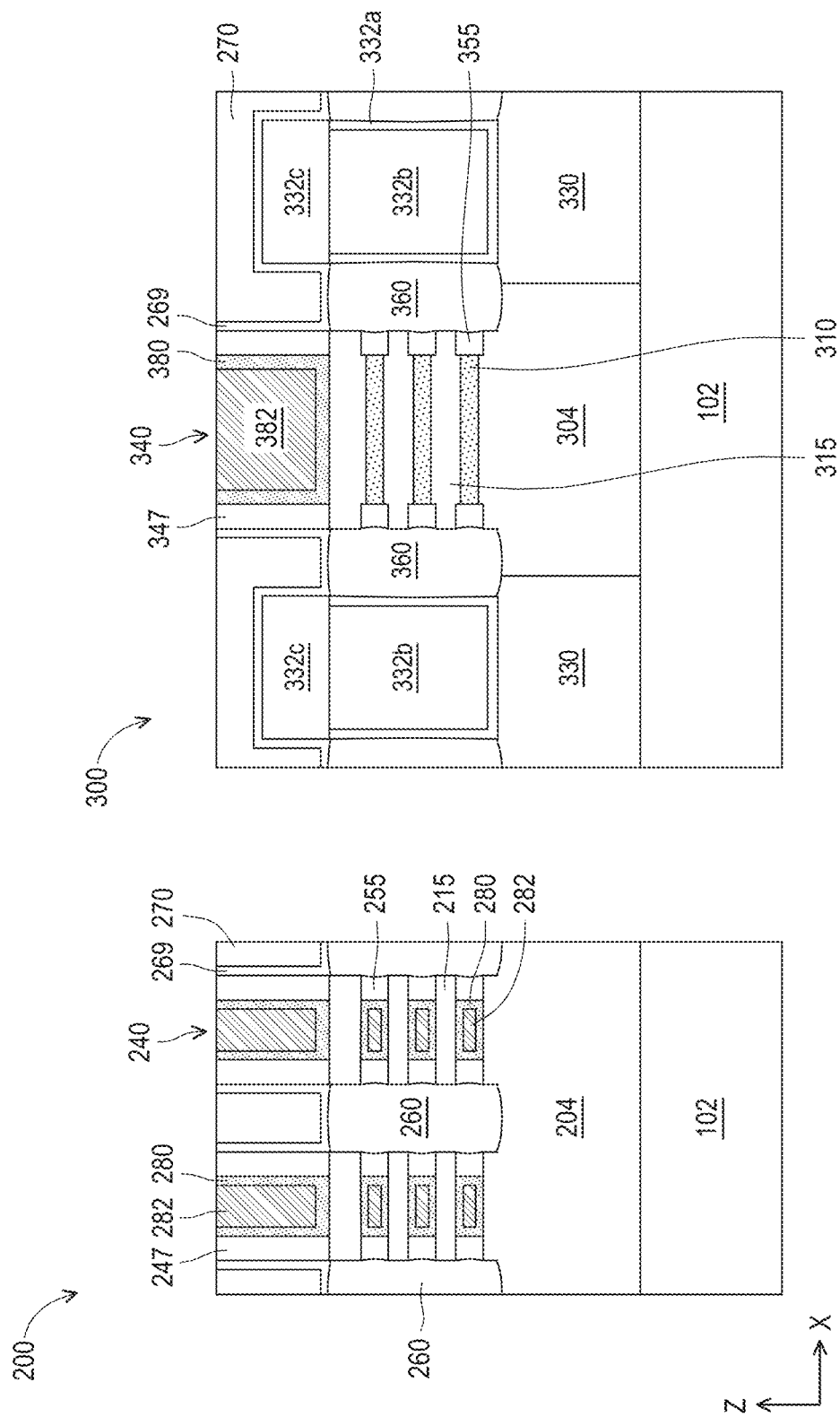

At operation 66, the method 50 (FIG. 2) replaces dummy gate structures 240' with functional gate structure 240 (such as high-k metal gates) and replaces dummy gate structures 340' with functional gate structure 340 (such as high-k metal gates), such as shown in FIG. 3K. This involves a variety of processes as briefly described below.

First, the operation 66 removes dummy gate structures 240' and 340' using one or more etching process, which forms gate trenches in circuit region 200 and in seal ring 300. The etching process may be a dry etching process, a wet etching process, other suitable etching process, or combinations thereof. The etching process is configured to selectively etch dummy gate structures 240'/340' with minimal (to no) etching of other structures, such as ILD layer 270, gate spacers 247/347, isolation structures 230/330, dummy fins 232/332, cladding layers 231/331, semiconductor layers 215/315, and semiconductor layers 210/310.

Next, the operation 66 removes the cladding layer 231 exposed in the gate trenches in circuit region 200. The etching process may selectively etch the cladding layer 231 with minimal (to no) etching of semiconductor layers 215/315, gate spacers 247/347, and inner spacers 255. As a result, the semiconductor layers 210 are exposed in the gate trenches in circuit region 200. In the seal ring 300, the cladding layer 331 during the operation 60. The topmost layer of the semiconductor layers 315 protects the underlying layers, particularly the semiconductor layers 310, from this etching process.

Next, the operation 66 removes the semiconductor layers 210 exposed in the gate trenches, leaving the semiconductor layers 215 suspended over the semiconductor layer 204 and connected with the EPI 260. This process is also referred to as a channel release process and the semiconductor layers 215 are also referred to as channel layers. The etching process selectively etches semiconductor layers 210 with minimal (to no) etching of semiconductor layers 215 and, in some embodiments, minimal (to no) etching of gate spacers 247 and/or inner spacers 255. In the seal ring 300, the topmost layer of the semiconductor layers 315 protects the underlying layers, particularly the semiconductor layers 310, from this etching process. Thus, there is no channel release in the seal ring 300.

Next, the operation 66 forms a gate dielectric layer 280 that wraps around each of the semiconductor layers 215 and forms a gate electrode 282 over the gate dielectric layer 280. The functional gate structure 240 comprises the gate dielectric layer 280 and the gate electrode 282. Similarly, operation 66 forms a gate dielectric layer 380 over the topmost layer of the semiconductor layers 315 and forms a gate electrode 382 over the gate dielectric layer 380. The gate structure 340 comprises the gate dielectric layer 380 and the gate electrode 382. The gate dielectric layers 280 and 380 may include a high-k dielectric material such as $HfO_2$, HfSiO, $HfSiO_4$, HfSiON, HfLaO, HfTaO, HfTiO, HfZrO, $HfAlO_x$, ZrO, $ZrO_2$, $ZrSiO_2$, AlO, AlSiO, $Al_2O_3$, TiO, $TiO_2$, LaO, LaSiO, $Ta_2O_3$, $Ta_2O_5$, $Y_2O_3$, $SrTiO_3$, BaZrO, $BaTiO_3$ (BTO), $(Ba,Sr)TiO_3$ (BST), $Si_3N_4$, hafnium dioxide-alumina ($HfO_2$—$Al_2O_3$) alloy, other suitable high-k dielectric material, or combinations thereof. The gate dielectric layers 280 and 380 may be formed by chemical oxidation, thermal oxidation, atomic layer deposition (ALD), chemical vapor deposition (CVD), and/or other suitable methods. In some embodiments, the gate structures 240/340 further includes an interfacial layer between the gate dielectric layer 280/380 and the semiconductor layers 215/315. The interfacial layer may include silicon dioxide, silicon oxynitride, or other suitable materials. In some embodiments, the gate electrode 282 includes an n-type or a p-type work function layer and a metal fill layer. For example, an n-type work function layer may comprise a metal with sufficiently low effective work function such as titanium, aluminum, tantalum carbide, tantalum carbide nitride, tantalum silicon nitride, or combinations thereof. For example, a p-type work function layer may comprise a metal with a sufficiently large effective work function, such as titanium nitride, tantalum nitride, ruthenium, molybdenum, tungsten, platinum, or combinations thereof. For example, a metal fill layer may include aluminum, tungsten, cobalt, copper, and/or other suitable materials. In embodiments, the gate electrode 382 does not include a work function layer as there are no functioning transistors in the seal ring. For example, the gate electrode 382 may include aluminum, tungsten, cobalt, copper, and/or other suitable materials. Various layers of the gate electrodes 282 and 382 may be formed by CVD, PVD, plating, and/or other suitable processes. Since the gate structures 240 and 340 include a high-k dielectric layer and metal layer(s), they are also referred to as high-k metal gates.

Figure 3L:
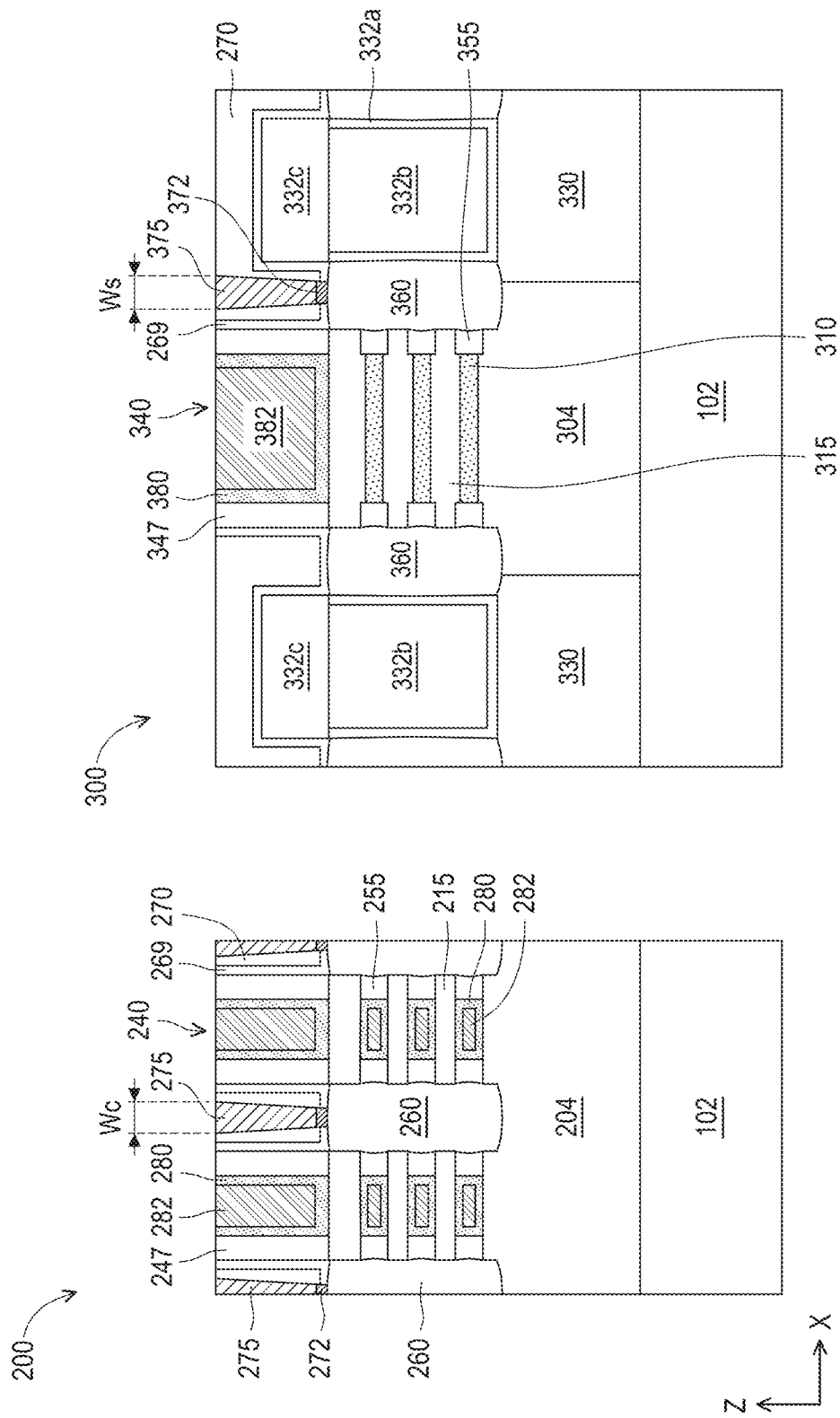

At operation 68, the method 50 (FIG. 2) performs further fabrications. For example, the method 50 etches contact holes to expose some of the EPI 260 and 360 and forms contacts 275 to electrically connected to EPI 260 and forms contacts 375 to electrically connected to EPI 360, such as shown in FIG. 3L. In the circuit region 200, a pair of contacts 275 are formed on two sides of the gate structure 240. Since structures in the seal ring 300 are not for forming functional circuits, there is no need to form a pair of contacts 375 on two sides of the gate structure 340. The design considerations of structures in the seal ring 300 are focusing on mechanical strengths of a "wall" of metal layers of interconnects that is built on the contacts 375. A single but wider contact 375 on one side of the semiconductor layers 304 provides stronger foundational support. A ratio between a width Ws of the contact 375 in the seal ring 300 and a width Wc of the contact 275 in the circuit region 200 may range from about 2:1 to about 6:1. If the ratio is smaller than 2:1, the contact 375 may not have sufficient landing area for providing desired mechanical strength. If the ratio is larger than 6:1, the contact 375 may be too close to edges of the gate structure 340 and overlaying inaccuracy may bring up fabrication risks.

The method 50 may form silicide layer(s) 272/372 between contacts 275 and EPI 260 and between contacts 375 and EPI 360, respectively. The silicide layer(s) may include titanium silicide (TiSi), nickel silicide (NiSi), tungsten silicide (WSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), or other suitable compounds. The contacts 275 and 375 may include a conductive barrier layer and a metal fill layer over the conductive barrier layer. The conductive barrier layer may include titanium (Ti), tantalum (Ta), tungsten (W), cobalt (Co), ruthenium (Ru), or a conductive nitride such as titanium nitride (TiN), titanium aluminum nitride (TiAlN), tungsten nitride (WN), tantalum nitride (TaN), or combinations thereof, and may be formed by CVD, PVD, ALD, and/or other suitable processes. The metal fill layer may include tungsten (W), cobalt (Co), molybdenum (Mo), ruthenium (Ru), or other metals, and may be formed by CVD, PVD, ALD, plating, or other suitable processes. The method 50 may perform mid-endof-line (MEOL) processes and back-end-of-line (BEOL) processes. For example, the method 50 may form gate vias connecting to the gate structures 240/340, form contact vias connecting to the contacts 275/375, and form one or more interconnect layers with wires and vias embedded in dielectric layers. The one or more interconnect layers connect gate, source, and drain electrodes of various transistors, as well as other circuits in the circuit region 200, to form an integrated circuit in part or in whole. The one or more interconnect layers also form part of the seal ring 300. The method 50 may also form passivation layer(s) over the interconnect layers.

Figure 3M:
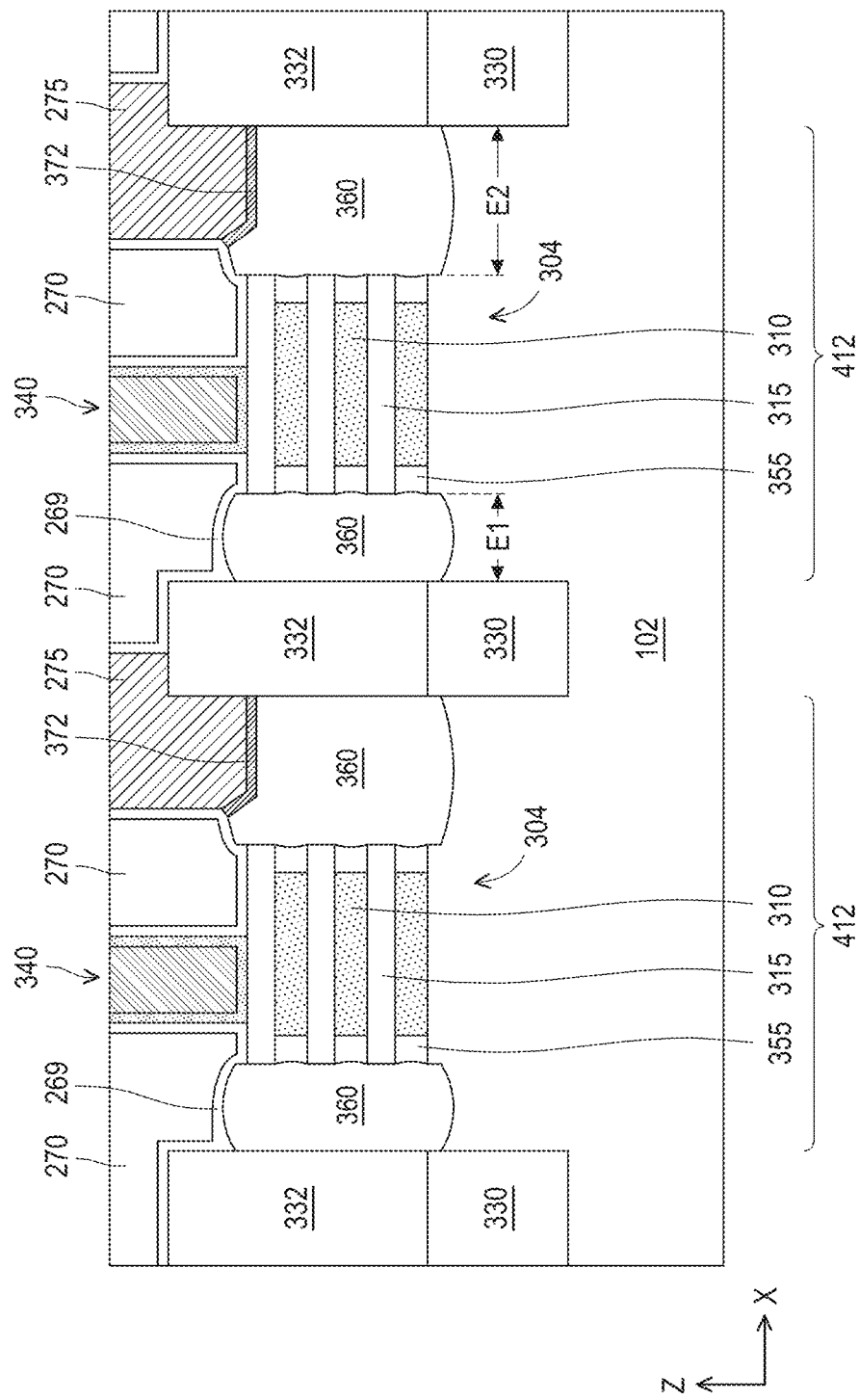

FIG. 3M illustrates a fragmentary cross-sectional view along of a portion of the semiconductor structure 100 along the "1-1" line in FIG. 1A showing two sub seal rings 412 separated by dummy fins 332 and isolation structures 330. The fragmentary cross-sectional view depicted in FIG. 3M more closely resembles the actual shape of the devices described herein. Many aspects of the embodiment in FIG. 3M are the same as or similar to those depicted in FIGS. 1A-1C and 3L. Reference numerals are repeated for ease of understanding and details of these elements are not necessarily repeated again below. Each of the semiconductor layers 304, gate structures 340, EPI 360, contacts 375, and isolation structures 330, as well as dummy fins 332, forms a generally ring shape surrounding the circuit region 200. The gate structure 340 is disposed completely within the boundary of the semiconductor layer 304 from the top view, without extending to the isolation structures 330. As depicted, the gate structure 340 may have a width smaller than a distance between two EPI 360, such that a top surface of the topmost semiconductor layer 315 is exposed on both sides of the gate structure 340 and in directly contact with the CESL 269. Further, the gate structure 340 is not disposed in the middle of the respective semiconductor layer 304, but closer to one EPI 360, leaving larger space on the other edge in forming a relatively larger EPI 360. The relatively larger EPI 360 provides more mechanical support to form a relatively larger contact 375. As depicted, the contact 375 is also deposited on a portion of the top surface of the dummy fin 332. In the depicted embodiment, the EPI 360 that is closer to the gate structure 340 has a smaller width E1 along the "x" direction, and the other EPI 360 that is distant to the gate structure 340 has a larger width E2 along the "x" direction. The wider EPI 360 also has larger volume and may be also deeper in the "z" direction. A ratio between the width E2 and the width E1 may range from about 1:1 to about 8:1 in the seal ring 300. If the ratio is smaller than 1:1, the EPI 360 may not have sufficient landing area for providing desired mechanical strength. If the ratio is larger than 8:1, the gate structures 340 may be too close to edges of the semiconductor layer 304 and overlaying inaccuracy may bring up risks of exposing sidewalls of sacrificial layers in the gate trenches during the replacement gate process.

Figure 4A:
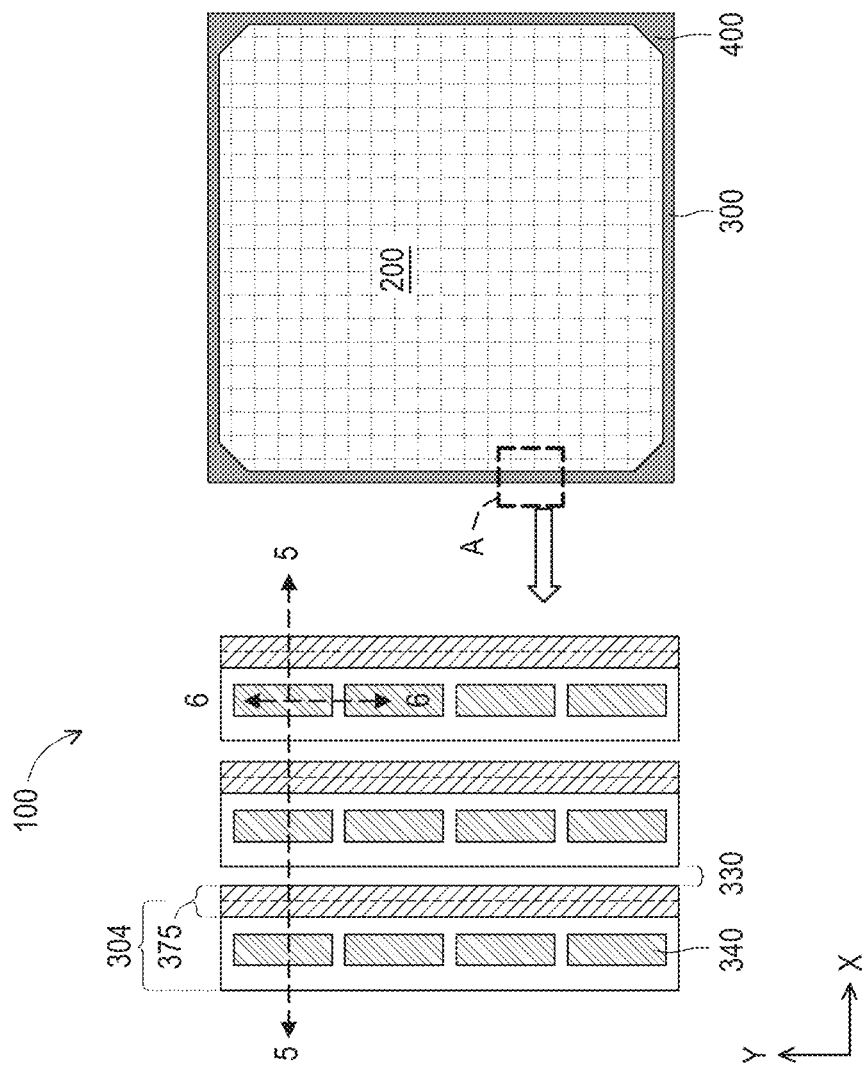
FIG. 4A is a top plan view of a semiconductor structure with a seal ring according to aspects of the present disclosure.
Figure 4B:
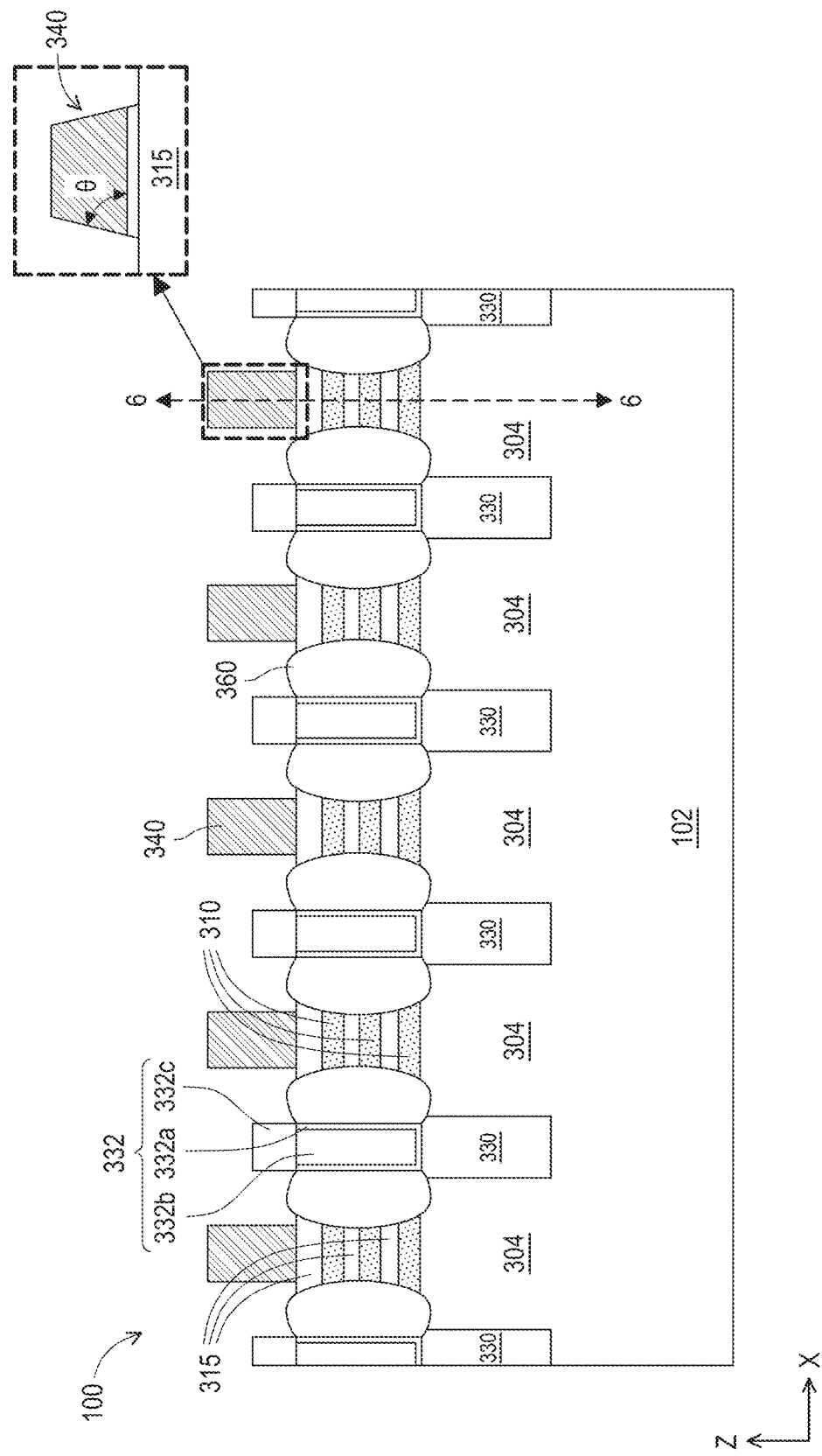
FIGS. 4B and 4C are cross-sectional views of the semiconductor structure in FIG. 4A along the "5-5" and "6-6" lines in FIG. 4A, respectively, according to aspects of the present disclosure.
Figure 4C:
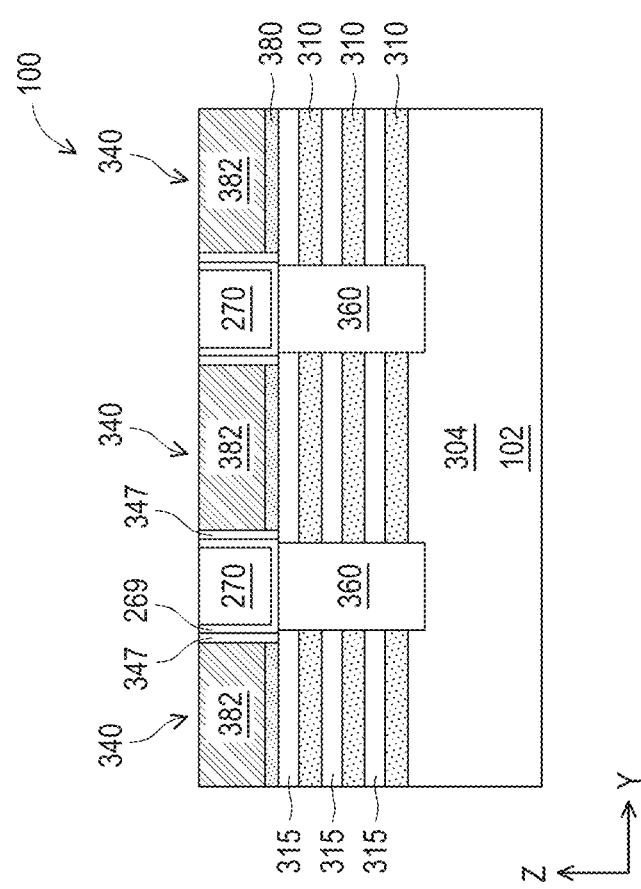

FIG. 4A is a top plan view of the semiconductor structure 100 according to another embodiment of the present disclosure. FIGS. 4B and 4C are cross-sectional views of a portion of the semiconductor structure 100 along the "5-5" and "6-6" lines in FIG. 4A, respectively, according to aspects of the present disclosure. The circuit region 200 in this embodiment is the same as the circuit region 200 in the embodiment shown in FIG. 1A. The seal ring 300 in this embodiment is similar to the seal ring 300 in the embodiment shown in FIG. 1A with some differences discussed below.

In the embodiment depicted in FIGS. 4A-4C, gate structures 340 are segments that form discrete rings surrounding the circuit region 200, rather than continuous rings as in the embodiment of FIGS. 1A-1E. Gate structures 340 are separate one from another along both the "x" and the "y" directions. Gate structures 340 are narrower than the underlying semiconductor layer 304 from a top view. Further, ILD 270 are formed to surround each gate structure 340 from a top view. The seal ring 300 shown in FIG. 4B is the same as the seal ring 300 shown FIG. 1B. The seal ring 300 shown in FIG. 4C is similar to the seal ring 300 shown FIG. 1C with some differences. In the embodiment depicted in FIG. 4C, EPI 360 is formed between gate structures 340 of the same discrete ring. Other features of the semiconductor structure 100 in this embodiment are the same as the embodiment shown in FIGS. 1A-1E.

The semiconductor structure 100 shown in FIGS. 4A-4C may be formed by an embodiment of the method 50. For example, during operation 58, dummy gate structures 340' are formed as segments of discrete rings surrounding the circuit region 200, and gate spacers 347 and ILD 270 are formed on all four sidewalls of the dummy gate structures 340'. Then, during operation 60, trenches are etched into the stacks 305 and self-aligned to the dummy gate structures 340' and gate spacers 347. Other operations of the method may be the same as those discussed above with reference to FIGS. 2 and 3A-3M.

Figure 5:
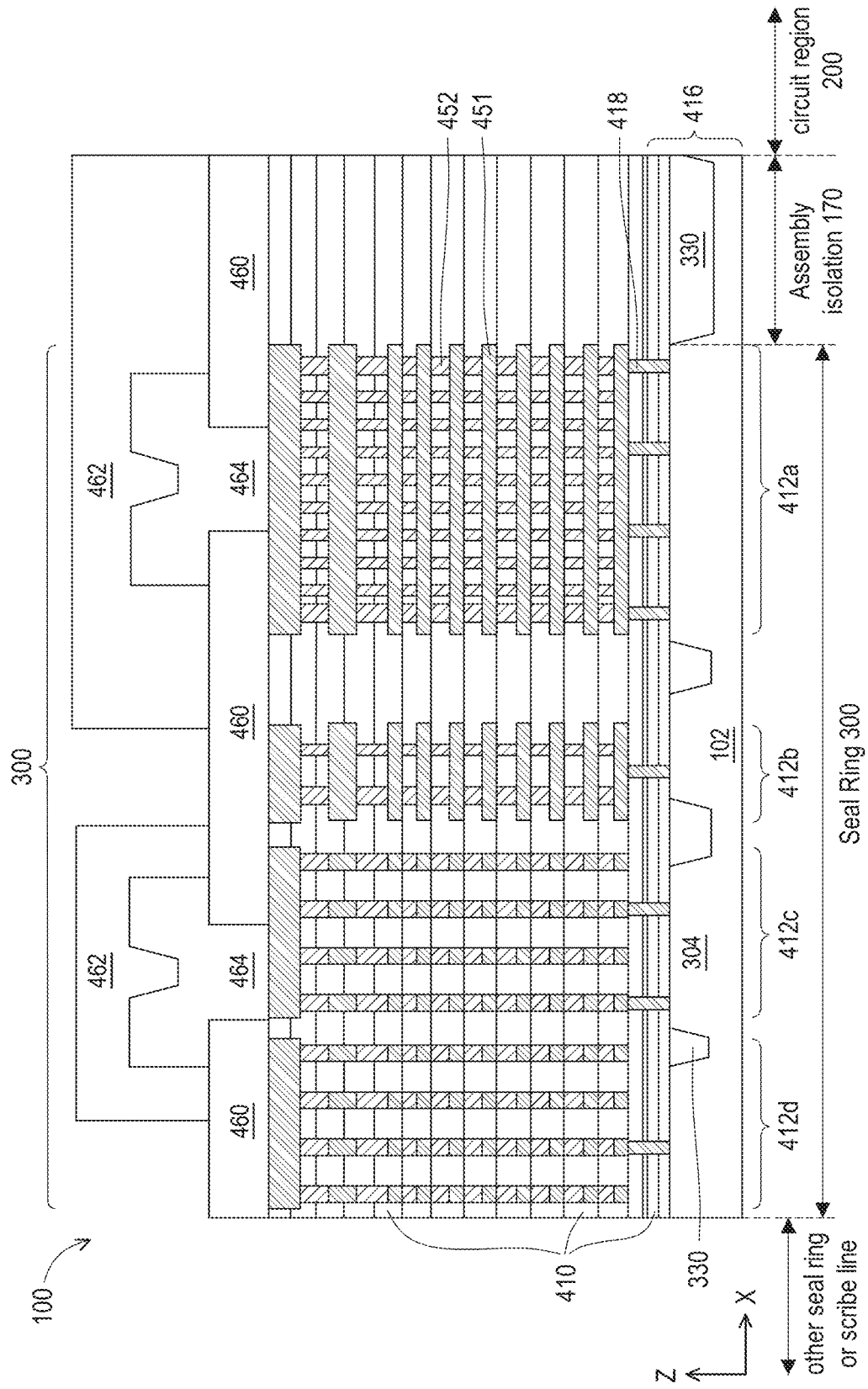
FIG. 5 shows a cross-sectional view of various layers of the semiconductor structure shown in FIGS. 1A and 4A, according to an embodiment of the present disclosure.

FIG. 5 illustrates a cross-section of the semiconductor structure 100 in the area A in FIGS. 1A and 4A according to an embodiment. The seal ring 300 includes sub seal rings 412a, 412b, 412c, and 412d. The embodiments shown in FIGS. 1A-1E and 4A-4C may be implemented in the layers denoted 416, including the stacks 305 of semiconductor layers 315 and 310, EPI 360, dummy fins 332, gate structures 340, and so on.

Each of the sub seal rings 412a, 412b, 412c, and 412d includes one or more conductive features 418. The conductive features 418 may include multiple conductors vertically connected, and may include doped semiconductors, metals, conductive nitride, conductive oxide, or other types of conductive materials. For example, conductive features 418 may include EPI 360, contacts 375, gate vias, and so on. Over the conductive features 418, each of the sub seal rings 412a, 412b, 412c, and 412d further includes multiple metal layers 451 stacked one over another and vertically connected by metal vias 452. Metal layers 451 and metal vias 452 may comprise copper, copper alloys, or other conductive materials and may be formed using damascene or dual damascene processes. Each of the metal layers 451 and the metal vias 452 may include a conductive barrier layer (such as TiN or TaN) surrounding a metal core (such as copper). In an embodiment, each of the metal layers 451 is formed into a ring or a ring-like structure (such as a substantially square ring) that surrounds the circuit region 200. In the present embodiment, each of the sub seal rings 412a and 412c further includes an aluminum pad 464.

The conductive features 418, the metal layers 451, and the metal vias 452 are embedded in dielectric layers 410. The dielectric layers 410 may include silicon oxide, silicon nitride, silicon oxynitride, low-k dielectric materials, extreme low-k (ELK) dielectric materials, or other suitable dielectric materials (for example, including silicon, oxygen, nitrogen, carbon, or other suitable isolation constituent), or combinations thereof. The semiconductor structure 100 further includes a passivation layer 460 over the dielectric layers 410 and another passivation layer 462 over the passivation layer 460. Each of the aluminum pads 464 includes a top portion that is disposed over the passivation layer 460 and a bottom portion that penetrates the passivation layer 460 and electrically connects to the sub seal rings 412*a* and 412*c*. In an embodiment, each of the aluminum pads 464 is formed into a shape of a ring that surrounds the circuit region 200. Aluminum pads 464 may be formed simultaneously with the formation of bond pads (not shown) that are exposed on the top surface of circuit region 200. The passivation layer 462 is disposed over the passivation layer 460 and the aluminum pads 464. Passivation layers 460 and 462 may be formed of oxides, nitrides, and combinations thereof, and may be formed of the same or different materials. Each of the sub seal rings 412*a-d* is in the form a vertical wall extending from the substrate 102 to the upper metal layer 451 and the aluminum pad 464.

The semiconductor structure 100 further includes an assembly isolation 170 between the seal ring 300 and the circuit region 200. The assembly isolation 170 includes the isolation structure (such as shallow trench isolation) 330. In some embodiments, the semiconductor structure 100 may include various dummy lines and dummy vias in the assembly isolation 170. Outside of the seal ring 300, the semiconductor structure 100 may include other seal ring(s) that are the same as or similar to the structure of the seal ring 300 in an embodiment. Alternatively or additionally, the semiconductor structure 100 may include scribe lines that surround the seal ring 300.

Although not intended to be limiting, embodiments of the present disclosure provide one or more of the following advantages. For example, embodiments of the present disclosure provide a semiconductor structure with a seal ring structure. The seal ring structure are formed using a process that is compatible with GAA fabrication process. In an embodiment, the seal ring includes a stack of semiconductor layers and a gate structure disposed directly above the stack of the semiconductor layers. The stack of the semiconductor layers does not undergo the channel release process performed to semiconductor layers in circuit region of the semiconductor structure, thereby providing a stable and robust base for the seal ring. Gate structures can be continuous rings or segments of discrete rings. Embodiments of the present disclosure can be readily integrated into existing semiconductor manufacturing processes.

In one example aspect, the present disclosure is directed to a method. The method includes providing a structure having a substrate and first and second semiconductor layers alternately stacked one over another above the substrate, etching the first and the second semiconductor layers to form a first continuous ring in a seal ring region of the structure, forming an isolation structure adjacent the first continuous ring in the seal ring region, forming a dummy gate structure that is disposed directly above the first continuous ring and completely within a boundary of the first continuous ring from a top view, growing first and second epitaxial features sandwiching the dummy gate structure, removing the dummy gate structure, resulting in a gate trench that exposes a topmost layer of the first semiconductor layers and does not expose side surfaces of the first and second semiconductor layers, and depositing a gate structure in the gate trench. In some embodiments, the method further includes applying an etching process, wherein the second semiconductor layers in the first continuous ring is protected by a topmost layer of the first semiconductor layers from the etching process. In some embodiments, the first continuous ring surrounds a circuit region of the structure. In some embodiments, the isolation structure forms a second continuous ring. In some embodiments, the first and second epitaxial features form third and fourth continuous rings, respectively. In some embodiments, the gate structure forms another continuous ring. In some embodiments, the gate structure is a segment of a discrete ring from the top view. In some embodiments, the method further includes depositing an interlayer dielectric layer on four sidewalls of the segment. In some embodiments, the gate structure is separated from the first epitaxial feature for a first distance and the second epitaxial feature for a second distance, the first distance being smaller than the second distance. In some embodiments, the method further includes forming a contact on the second epitaxial feature, while the first epitaxial feature is free of a contact thereon.

In another example aspect, the present disclosure is directed to a method. The method includes providing a structure having a substrate and first and second semiconductor layers alternately stacked one over another above the substrate, etching the first and the second semiconductor layers to form a fin structure in a circuit region of the structure and a first continuous ring in a seal ring region of the structure, wherein the first continuous ring surrounds the circuit region, forming a first gate structure traversing the fin structure, forming a second gate structure that is disposed directly above the first continuous ring and completely within a boundary of the first continuous ring from a top view, growing first and second epitaxial features sandwiching the first gate structure, growing third and fourth epitaxial features sandwiching the second gate structure, and forming contacts on each of the first, second, and third epitaxial features, but not on the fourth epitaxial feature. In some embodiments, the first and second epitaxial features have substantially a same volume, and the third epitaxial feature is larger than the fourth epitaxial feature. In some embodiments, the contact on the third epitaxial feature has a larger width than each of the contacts on the first and second epitaxial features. In some embodiments, the second gate structure forms a second continuous ring. In some embodiments, the second gate structure is a segment of a discrete ring from the top view. In some embodiments, the method further includes forming first isolation structures on both sides of the fin structure, and forming a second isolation structure adjacent the first continuous ring in the seal ring region, wherein the second isolation structure forms a second continuous ring.

In yet another example aspect, the present disclosure is directed to a semiconductor structure. The semiconductor structure includes a substrate, a circuit region over the substrate, the circuit region including two source/drain structures of a transistor, first semiconductor layers connecting the two source/drain structures, and a first gate structure disposed between the two source/drain structures and wrapping around each of the first semiconductor layers, and a seal ring over the substrate and surrounding the circuit region, the seal ring including two epitaxially grown semiconductor structures, second semiconductor layers, third semiconductor layers, and a second gate structure. The second and the third semiconductor layers are alternately stacked one over another to form a stack of layers, the stack of layers forms a continuous ring surrounding the circuit region, a topmost layer of the stack of layers is one of the third semiconductor layers, and the second gate structure is disposed between the two epitaxially grown semiconductor structures and above the topmost layer of the stack of layers and within a boundary of the stack of layers from a top view. The first and the third semiconductor layers include a first semiconductor material, and the second semiconductor layers include a second semiconductor material that is different from the first semiconductor material. In some embodiments, the second gate structure forms a second continuous ring from the top view. In some embodiments, the second gate structure is a segment of a discrete ring from the top view. In some embodiments, the two epitaxially grown semiconductor structures of the seal ring have different volumes.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
providing a structure having a substrate and first and second semiconductor layers alternately stacked one over another above the substrate;
etching the first and the second semiconductor layers to form a first continuous ring in a seal ring region of the structure;
forming an isolation structure adjacent the first continuous ring in the seal ring region;
forming a dummy gate structure that is disposed directly above the first continuous ring and completely within a boundary of the first continuous ring from a top view;
growing first and second epitaxial features sandwiching the dummy gate structure;
removing the dummy gate structure, resulting in a gate trench that exposes a topmost layer of the first semiconductor layers and does not expose side surfaces of the first and second semiconductor layers; and
depositing a gate structure in the gate trench.

2. The method of claim 1, further comprising:
applying an etching process, wherein the second semiconductor layers in the first continuous ring is protected by a topmost layer of the first semiconductor layers from the etching process.

3. The method of claim 1, wherein the first continuous ring surrounds a circuit region of the structure.

4. The method of claim 1, wherein the isolation structure forms a second continuous ring.

5. The method of claim 4, wherein the first and second epitaxial features form third and fourth continuous rings, respectively.

6. The method of claim 1, wherein the gate structure forms another continuous ring.

7. The method of claim 1, wherein the gate structure is a segment of a discrete ring from the top view.

8. The method of claim 7, further comprising:
depositing an interlayer dielectric layer on four sidewalls of the segment.

9. The method of claim 1, wherein the gate structure is separated from the first epitaxial feature for a first distance and the second epitaxial feature for a second distance, wherein the first distance is smaller than the second distance.

10. The method of claim 9, further comprising:
forming a contact on the second epitaxial feature, while the first epitaxial feature is free of a contact thereon.

11. A method, comprising:
providing a structure having a substrate and first and second semiconductor layers alternately stacked one over another above the substrate;
etching the first and the second semiconductor layers to form a fin structure in a circuit region of the structure and a first continuous ring in a seal ring region of the structure, wherein the first continuous ring surrounds the circuit region;
forming a first gate structure traversing the fin structure;
forming a second gate structure that is disposed directly above the first continuous ring and completely within a boundary of the first continuous ring from a top view;
growing first and second epitaxial features sandwiching the first gate structure;
growing third and fourth epitaxial features sandwiching the second gate structure; and
forming contacts on each of the first, second, and third epitaxial features, but not on the fourth epitaxial feature.

12. The method of claim 11, wherein the first and second epitaxial features have substantially a same volume, and wherein the third epitaxial feature is larger than the fourth epitaxial feature.

13. The method of claim 11, wherein the contact on the third epitaxial feature has a larger width than each of the contacts on the first and second epitaxial features.

14. The method of claim 11, wherein the second gate structure forms a second continuous ring.

15. The method of claim 11, wherein the second gate structure is a segment of a discrete ring from the top view.

16. The method of claim 11, further comprising:
forming first isolation structures on both sides of the fin structure; and
forming a second isolation structure adjacent the first continuous ring in the seal ring region, wherein the second isolation structure forms a second continuous ring.

17. A semiconductor structure, comprising:
a substrate;
a circuit region over the substrate, wherein the circuit region includes two source/drain structures of a transistor, first semiconductor layers connecting the two source/drain structures, and a first gate structure disposed between the two source/drain structures and wrapping around each of the first semiconductor layers; and
a seal ring over the substrate and surrounding the circuit region, wherein the seal ring includes two epitaxially grown semiconductor structures, second semiconductor layers, third semiconductor layers, and a second gate structure,
wherein the second and the third semiconductor layers are alternately stacked one over another to form a stack of layers, the stack of layers forms a continuous ring surrounding the circuit region, a topmost layer of the stack of layers is one of the third semiconductor layers, and the second gate structure is disposed between the two epitaxially grown semiconductor structures and above the topmost layer of the stack of layers and within a boundary of the stack of layers from a top view, wherein the first and the third semiconductor layers include a first semiconductor material, and the second semiconductor layers include a second semiconductor material that is different from the first semiconductor material.

18. The semiconductor structure of claim 17, wherein the second gate structure forms a second continuous ring from the top view.

19. The semiconductor structure of claim 17, wherein the second gate structure is a segment of a discrete ring from the top view.

20. The semiconductor structure of claim 17, wherein the two epitaxially grown semiconductor structures of the seal ring have different volumes.

\* \* \* \* \*